United States Patent
Komuro

(10) Patent No.: US 7,124,485 B2
(45) Date of Patent: Oct. 24, 2006

(54) METHOD OF MANUFACTURING A PIEZOELECTRIC THIN FILM RESONATOR

(75) Inventor: Eiju Komuro, Tokyo (JP)

(73) Assignee: TDK Corporation, Tokyo (JP)

( * ) Notice: Subject to any disclaimer, the term of this patent is extended or adjusted under 35 U.S.C. 154(b) by 238 days.

(21) Appl. No.: 10/819,134

(22) Filed: Apr. 7, 2004

(65) Prior Publication Data

US 2004/0200050 A1 Oct. 14, 2004

(30) Foreign Application Priority Data

Apr. 11, 2003 (JP) ............................. 2003-107845

(51) Int. Cl.
*H04R 17/00* (2006.01)

(52) U.S. Cl. .................. 29/25.35; 29/831; 29/832; 29/846; 29/847

(58) Field of Classification Search ............... 29/25.35, 29/846, 847, 831, 832; 310/324, 328, 320, 310/360; 427/100, 98.4, 98.5, 96.1, 97.3, 427/97.1, 96; 216/41, 49, 40

See application file for complete search history.

(56) References Cited

U.S. PATENT DOCUMENTS

| | | | | |
|---|---|---|---|---|
| 4,456,850 A | * | 6/1984 | Inoue et al. | 310/324 |
| 5,075,641 A | * | 12/1991 | Weber et al. | 331/108 C |
| 5,692,279 A | * | 12/1997 | Mang et al. | 29/25.35 |
| 6,260,960 B1 | * | 7/2001 | Hashizume et al. | 347/70 |
| 6,271,619 B1 | * | 8/2001 | Yamada et al. | 310/324 |
| 6,657,363 B1 | * | 12/2003 | Aigner | 310/324 |

FOREIGN PATENT DOCUMENTS

| | | |
|---|---|---|
| JP | 58137317 | 8/1983 |
| JP | 58153412 | 9/1983 |
| JP | 60171822 | 9/1985 |
| JP | 9-64683 | 3/1997 |
| JP | 10200354 | 7/1998 |
| JP | 1-251159 | 9/2001 |

OTHER PUBLICATIONS

English Language Abstract of JP 2001-251159.
English Language Abstract of JP 58-137317.
English Language Abstract of JP 58-153412.
English Language Abstract of JP 60-171822.
English Language Abstract of JP 9-64683.
English Language Abstract of JP 10-200354.

* cited by examiner

*Primary Examiner*—A. Dexter Tugbang
*Assistant Examiner*—Tai Van Nguyen
(74) *Attorney, Agent, or Firm*—Greenblum & Bernstein, P.L.C.

(57) ABSTRACT

A method of manufacturing a piezoelectric thin film resonator forms, after forming a piezoelectric film on a substrate so as to cover a lower electrode formed on the substrate, a resist layer so as to cover the piezoelectric film, forms a mask composed of the resist layer on the piezoelectric film by forming, in the resist layer, an exposure hole for exposing a formation part of an upper electrode on the piezoelectric film, forms an electrode material layer for forming the upper electrode on the piezoelectric film exposed via the exposure hole and on the mask, and then forms the upper electrode by removing the electrode material layer on the mask by removing the mask.

18 Claims, 12 Drawing Sheets

*F I G . 5*
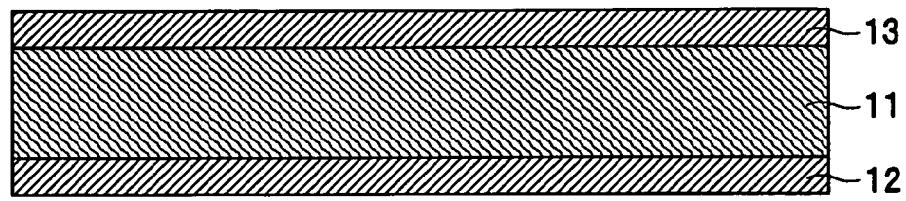
*F I G . 6*
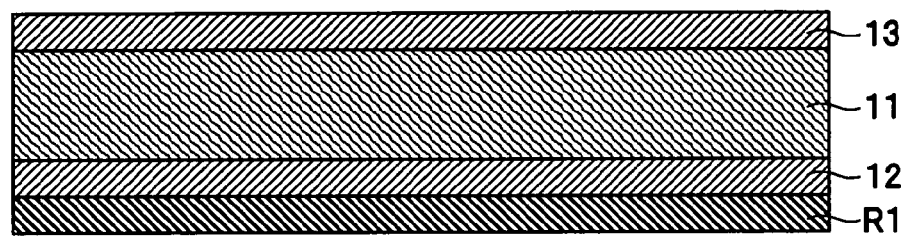
*F I G . 7*
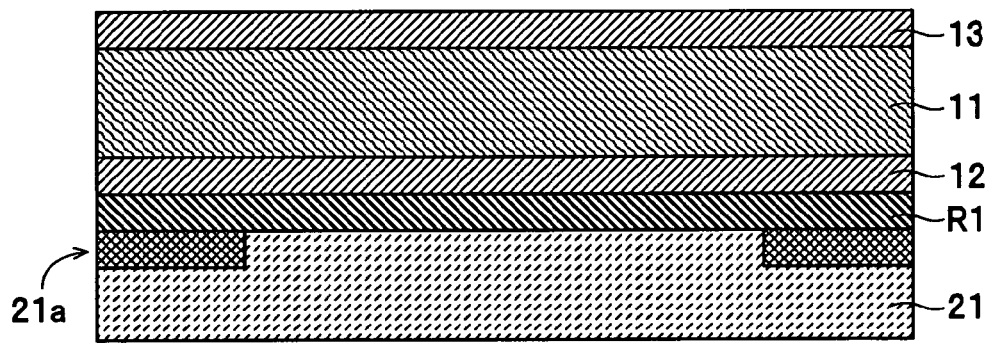
*F I G . 8*
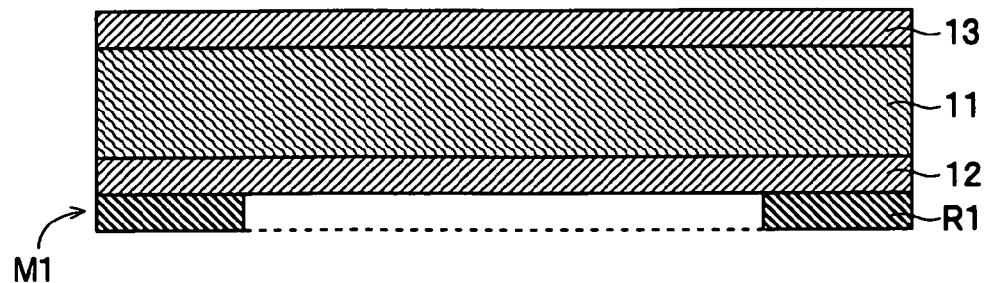

METHOD OF MANUFACTURING A PIEZOELECTRIC THIN FILM RESONATOR

BACKGROUND OF THE INVENTION

1. Field of the Invention

This invention relates to a method of manufacturing and a manufacturing apparatus for a piezoelectric thin film resonator in which a lower electrode, a piezoelectric film, and an upper electrode are formed in order on a substrate, a piezoelectric thin film resonator manufactured according to this method of manufacturing, and an electronic component constructed so as to include this piezoelectric thin film resonator.

2. Description of the Related Art

As one example of a piezoelectric thin film resonator manufactured according to this kind of method of manufacturing, a piezoelectric thin film element for use as a filter or the like in an electronic appliance, such as a mobile phone, is disclosed by Japanese Laid-Open Patent Publication No. 2001-251159. This piezoelectric thin film element is constructed by forming a lower electrode, a piezoelectric film, and an upper electrode in that order on a silicon substrate. In this case, the silicon substrate is a substrate for a piezoelectric thin film element with a silicon oxide film being formed on an upper surface thereof and a layer of a mask material being formed on a lower surface thereof. Also, a resonance cavity is formed in the silicon substrate so that during driving, the lower electrode, the piezoelectric film and the upper electrode can resonate.

When manufacturing this piezoelectric thin film element, first a metal film for forming the lower electrode is formed on the silicon oxide film on the silicon substrate and etching is then carried out to leave parts of the metal film corresponding to the lower electrode and remove unnecessary parts, thereby forming the lower electrode. At this time, as one example, a mask is formed by forming a photoresist layer on the metal film and then exposing and developing the photoresist layer, and then etching is carried out using this mask. Next, the piezoelectric film is formed so as to cover the lower electrode by carrying out sputtering, for example, on the silicon substrate. After this, after the metal film for forming the upper electrode has been formed on the piezoelectric film, etching is carried out to leave parts of the metal film corresponding to the upper electrode and remove unnecessary parts, thereby forming the upper electrode. At this time, in the same way as when the lower electrode is formed, etching is carried out using a mask formed by exposing and developing a photoresist layer, for example. Next, etching is carried out with the mask material formed on the lower surface of the silicon substrate as a mask to form the resonance cavity. After this, by applying an organic resin material so as to cover the piezoelectric film and the upper electrode, an organic resin film is formed, thereby completing the piezoelectric thin film element.

However, by investigating the conventional method of manufacturing a piezoelectric thin film element, the inventors of the present invention discovered the following problem. That is, the conventional method of manufacturing forms the upper electrode by etching a metal film formed on the piezoelectric film. Accordingly, if the upper electrode is formed by wet etching, depending on the combination of the material forming the piezoelectric film and the metal(s) forming the upper electrode, when the etching liquid removes unnecessary parts of the metal film and contacts the surface of the piezoelectric film, the etching liquid for etching the metal film also etches the piezoelectric film. Also, if etching is completed just before the etching liquid starts to etch the piezoelectric film, some parts of the metal film that should be removed will definitely remain on the piezoelectric film. In this case, if the piezoelectric film is etched or parts of the metal film unintentionally remain, the electrical characteristics of the piezoelectric thin film element will not satisfy the desired characteristics for which the piezoelectric thin film element was designed. Accordingly, it is necessary to carry out etching so as to completely remove unnecessary parts of the metal film without etching the piezoelectric film. However, the time required to completely etch the metal film changes every time etching is carried out due to factors such as minute fluctuations in the thickness of the metal film and changes in the temperature of the etching liquid. Accordingly, with the conventional method of manufacturing a piezoelectric thin film element, there is the problem that it is difficult to completely remove unnecessary parts of the metal film without etching the piezoelectric film when forming the upper electrode. In addition, with this conventional method of manufacturing, when the lower electrode is formed, there is the problem that the substrate material present below the lower electrode is etched or the problem that the metal film to be removed remains on the substrate material. Accordingly, such problems should preferably be solved.

SUMMARY OF THE INVENTION

The present invention was conceived in view of the problems described above and it is a principal object of the present invention to provide a method of manufacturing and a manufacturing apparatus that can reliably manufacture a piezoelectric thin film resonator with desired electrical characteristics, a piezoelectric thin film resonator manufactured according to this method of manufacturing, and an electronic component constructed so as to include this piezoelectric thin film resonator.

To achieve the stated object, a method of manufacturing a piezoelectric thin film resonator according to the present invention forms, after forming a piezoelectric film on a substrate so as to cover a lower electrode formed on the substrate, a resist layer so as to cover the piezoelectric film, forms a mask composed of the resist layer on the piezoelectric film by forming, in the resist layer, an exposure hole for exposing a formation part of an upper electrode on the piezoelectric film, forms an electrode material layer for forming the upper electrode on the piezoelectric film exposed via the exposure hole and on the mask, and then forms the upper electrode by removing the electrode material layer on the mask by removing the mask.

A manufacturing apparatus for manufacturing a piezoelectric thin film resonator is constructed so as to be able to form a piezoelectric film on a substrate so as to cover a lower electrode formed on the substrate, to then form a resist layer so as to cover the piezoelectric film, to form a mask composed of the resist layer on the piezoelectric film by forming, in the resist layer, an exposure hole for exposing a formation part of an upper electrode on the piezoelectric film, to then form an electrode material layer for forming the upper electrode on the piezoelectric film exposed via the exposure hole and on the mask, and to then form the upper electrode by removing the electrode material layer on the mask by removing the mask.

According to the above method of manufacturing and manufacturing apparatus for a piezoelectric thin film resonator, after the electrode material layer has been formed on a mask formed on the piezoelectric film and the piezoelectric film exposed via the exposure hole, the mask is removed to form the upper electrode, so that when the upper electrode is formed, it is possible to dispense with a step of etching that corrodes the piezoelectric film. Accordingly, it is possible to avoid problems such as fluctuations in the thickness of the piezoelectric film or parts of the electrode material layer and the like remaining on the piezoelectric film, so that a piezoelectric thin film resonator with the desired electrical characteristics can be easily and reliably manufactured. In addition, by constructing an electronic component, such as a filter, using this piezoelectric thin film resonator, it is possible to provide an electronic component that satisfies the desired electrical characteristics.

To achieve the stated object, another method of manufacturing a piezoelectric thin film resonator according to the present invention forms a resist layer so as to cover a substrate, forms a mask composed of the resist layer on the substrate by forming, in the resist layer, an exposure hole for exposing a formation part of a lower electrode on the substrate, forms an electrode material layer for forming the lower electrode on the substrate exposed via the exposure hole and on the mask, then forms the lower electrode by removing the electrode material layer on the mask by removing the mask, forms a piezoelectric film on the substrate so as to cover the lower electrode and then forms an upper electrode on the piezoelectric film.

Another manufacturing apparatus for manufacturing a piezoelectric thin film resonator according to the present invention is constructed so as to be able to form a resist layer so as to cover a substrate, to form a mask composed of the resist layer on the substrate by forming, in the resist layer, an exposure hole for exposing a formation part of a lower electrode on the substrate, to form an electrode material layer for forming the lower electrode on the substrate exposed via the exposure hole and on the mask, to then form the lower electrode by removing the electrode material layer on the mask by removing the mask, to form a piezoelectric film on the substrate so as to cover the lower electrode, and to then form an upper electrode on the piezoelectric film.

According to the above method of manufacturing and manufacturing apparatus for a piezoelectric thin film resonator, after the electrode material layer has been formed on the mask formed so as to cover the substrate and the substrate exposed via the exposure hole, the mask is removed to form the lower electrode, so that when the lower electrode is formed, it is possible to dispense with a step of etching that corrodes the substrate. Accordingly, it is possible to avoid problems such as fluctuations in the thickness of the substrate or parts of the electrode material layer and the like remaining on the substrate, so that a piezoelectric thin film resonator with the desired electrical characteristics can be easily and reliably manufactured. In addition, by constructing an electronic component, such as a filter, using this piezoelectric thin film resonator, it is possible to provide an electronic component that satisfies the desired electrical characteristics. In this case, by forming both the lower electrode and the upper electrode using a lift off method, it is possible to manufacture a piezoelectric thin film resonator with the desired electrical characteristics more reliably.

To achieve the stated object, another method of manufacturing a piezoelectric thin film resonator according to the present invention forms a resist layer so as to cover a substrate, forms a mask composed of the resist layer on the substrate by forming, in the resist layer, an exposure hole for exposing a formation part of a lower electrode on the substrate, forms an electrode material layer for forming the lower electrode on the substrate exposed via the exposure hole and on the mask, then forms the lower electrode by removing the electrode material layer on the mask by removing the mask, forms a piezoelectric film on the substrate so as to cover the lower electrode and then forms a resist layer so as to cover the piezoelectric film, forms a mask composed of the resist layer on the piezoelectric film by forming, in the resist layer on the piezoelectric film, an exposure hole for exposing a formation part of an upper electrode on the piezoelectric film, forms an electrode material layer for forming the upper electrode on the piezoelectric film exposed via the exposure hole and on the mask, and then forms the upper electrode by removing the electrode material layer on the mask by removing the mask.

Another manufacturing apparatus for manufacturing a piezoelectric thin film resonator according to the present invention is constructed so as to be able to form a resist layer so as to cover a substrate, to form a mask composed of the resist layer on the substrate by forming, in the resist layer, an exposure hole for exposing a formation part of a lower electrode on the substrate, to form an electrode material layer for forming the lower electrode on the substrate exposed via the exposure hole and on the mask, to then form the lower electrode by removing the electrode material layer on the mask by removing the mask, to form a piezoelectric film on the substrate so as to cover the lower electrode, to then form a resist layer so as to cover the piezoelectric film, to form a mask composed of the resist layer on the piezoelectric film by forming, in the resist layer on the piezoelectric film, an exposure hole for exposing a formation part of an upper electrode on the piezoelectric film, to then form an electrode material layer for forming the upper electrode on the piezoelectric film exposed via the exposure hole and on the mask, and to then form the upper electrode by removing the electrode material layer on the mask by removing the mask.

According to the above method of manufacturing and manufacturing apparatus for a piezoelectric thin film resonator, by forming the exposure hole so that a formation surface side for the electrode material layer in the thickness direction of the resist layer protrudes, at a rim of the exposure hole, above the formation part of the upper electrode, it is possible to avoid the problem of the electrode material layer being formed on side walls of the exposure hole when the electrode material layer is formed. Accordingly, when soaking in a resist stripping chemical to remove the mask, it is possible to sufficiently soak the mask in the resist stripping chemical, and as a result, the mask can be reliably stripped (removed) and the problem of burrs being formed at ends of the upper electrode can be avoided.

In this case, when forming the mask, it is preferable for the method of manufacturing and the manufacturing apparatus described above to form the exposure hole so that an upper surface side in the thickness direction of the resist layer protrudes, at a rim of the exposure hole, further above the formation part than a lower surface side in the thickness direction. According to this preferred aspect, it is possible to avoid the problem of the electrode material layer being formed on side walls of the exposure hole when the electrode material layer is formed. Accordingly, when soaking in a resist stripping chemical to remove the mask, it is possible to sufficiently soak the mask in the resist stripping chemical, and as a result, the mask can be reliably stripped (removed) and the problem of burrs being formed at ends of the upper electrode can be avoided.

Also, according to the above method of manufacturing, it is preferable, after the resist layer has been formed, to subject the resist layer to a surface treatment by soaking in a benzene-type solvent, and to then form the exposure hole in the resist layer so as to expose the formation part. According to this preferred aspect, it is possible, without using a special resist material, to reliably strip (remove) the mask during formation of an electrode (at least one of the upper electrode and the lower electrode, hereinafter simply referred to as the "electrode") and to reliably avoid the problem of burrs being formed at the end of the electrode.

Also, according to the above method of manufacturing, it is preferable to form the exposure hole by forming a first resist layer that can be dissolved by a developer liquid, then forming a second resist layer so as to cover the first resist layer, carrying out an exposure process on the second resist layer, and then soaking in the developer liquid so that the exposure hole passes through both the first resist layer and the second resist layer. According to this preferred aspect, it is possible, without using a special resist material, to reliably strip (remove) the mask when forming the electrode and the problem of burrs being formed at ends of the electrode can be reliably avoided.

In this method of manufacturing, the piezoelectric film should preferably be formed with zinc oxide (ZnO). According to this preferred aspect, it is possible to manufacture a piezoelectric thin film resonator with a large passing bandwidth in the filter characteristics. In this case, according to this method of manufacturing, since etching liquid is not used, even in the case where the piezoelectric film is formed using ZnO that is easily corroded by acid, such as acetic acid, phosphoric acid, and nitric acid, included in etching liquid, a piezoelectric thin film resonator with the desired electrical characteristics can be easily and reliably manufactured.

Also, according to this method of manufacturing a piezoelectric thin film resonator, the electrode material layer should preferably be formed with aluminum (Al) or gold (Au). According to this preferred aspect, it is possible to manufacture a piezoelectric thin film resonator with a sufficiently high resonance frequency. In addition, by forming the electrode material layer of gold, it is possible to manufacture a piezoelectric thin film resonator with a low insertion loss for passing signals.

Also, the piezoelectric thin film resonator according to the present invention is manufactured according to the above method of manufacturing a piezoelectric thin film resonator. This means that the piezoelectric thin film resonator can have the desired electrical characteristics.

Also, an electronic component according to the present invention is constructed so as to include the piezoelectric thin film resonator described above. This means that the electronic component can satisfy the desired electrical characteristics.

It should be noted that the disclosure of the present invention relates to a content of Japanese Patent Application 2003-107845 that was filed on 11 Apr. 2003 and the entire content of which is herein incorporated by reference.

BRIEF DESCRIPTION OF THE DRAWINGS

These and other objects and features of the present invention will be explained in more detail below with reference to the attached drawings, wherein:

FIG. 5 is a cross-sectional view of a silicon substrate in a state where a lower barrier layer and an upper barrier layer have been respectively formed on a lower surface and an upper surface thereof;

FIG. 6 is a cross-sectional view of a state where a resist layer has been formed on a lower surface of the lower barrier layer;

FIG. 7 is a cross-sectional view of a state where a glass mask has been placed in contact with a lower surface of the resist layer and exposure is carried out;

FIG. 8 is a cross-sectional view of a state where the resist layer has been developed to form a mask;

DESCRIPTION OF THE PREFERRED EMBODIMENTS

Hereafter, preferred embodiments of a method of manufacturing and a manufacturing apparatus for a piezoelectric thin film resonator according to the present invention, a piezoelectric thin film resonator manufactured according to this method of manufacturing, and an electronic component constructed so as to include this piezoelectric thin film resonator will be described with reference to the attached drawings.

First, the construction of a piezoelectric thin film resonator 1 will be described with reference to the drawings.

Figure 1:
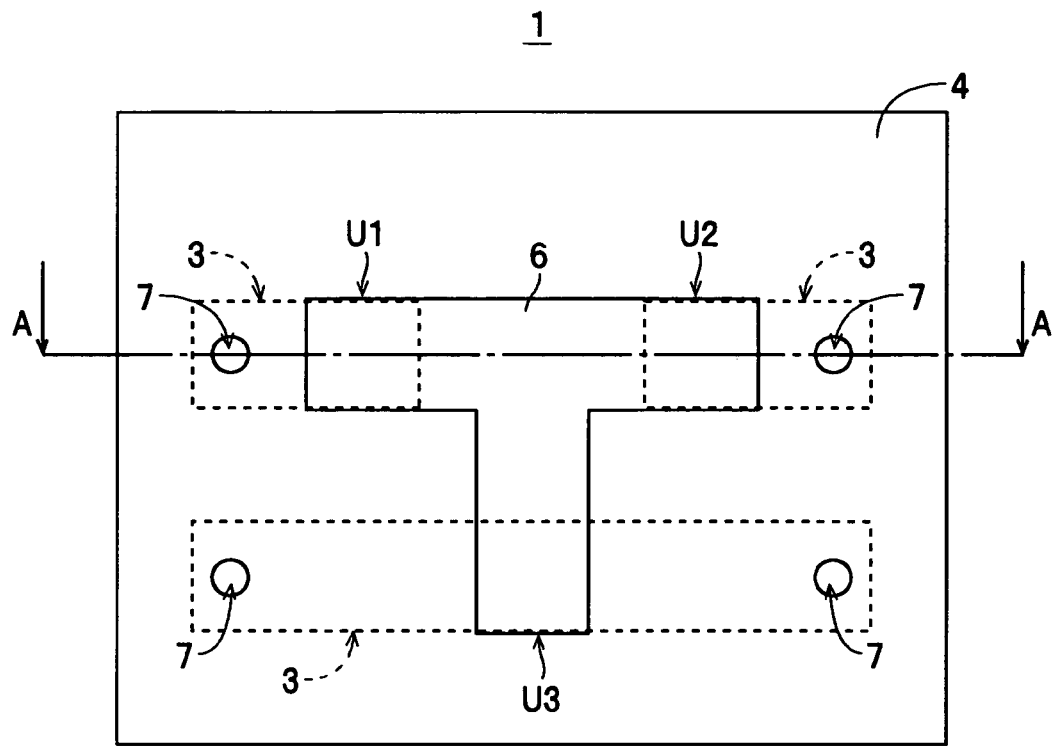
FIG. 1 is a plan view of a piezoelectric thin film resonator manufactured according to a method of manufacturing according to an embodiment of the present invention.
Figure 2:
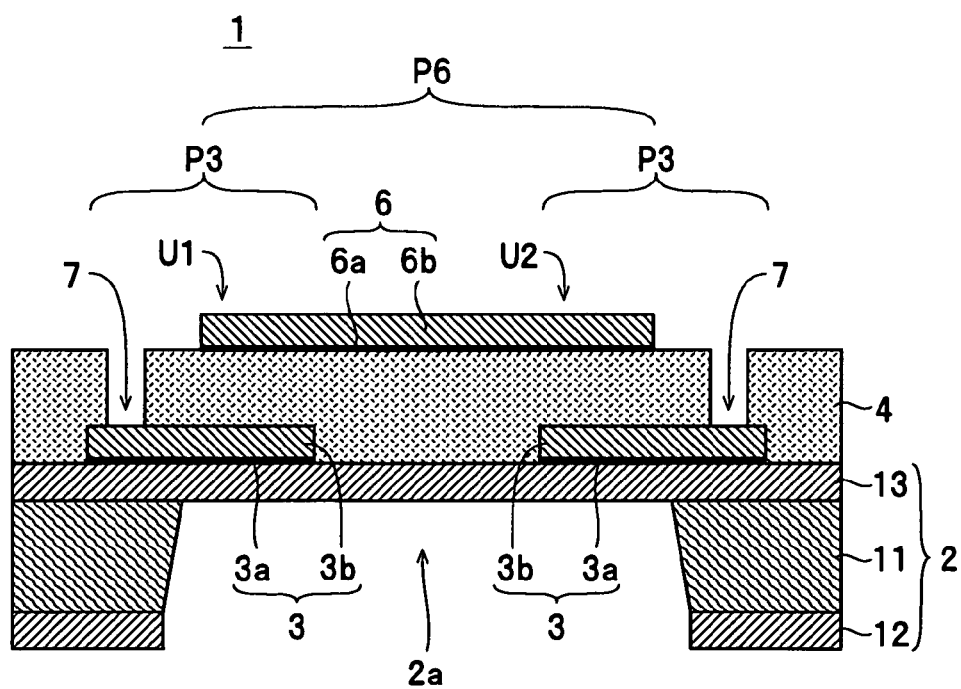
FIG. 2 is a cross-sectional view along a line A—A in FIG. 1 showing a layered construction of the piezoelectric thin film resonator.
Figure 3:
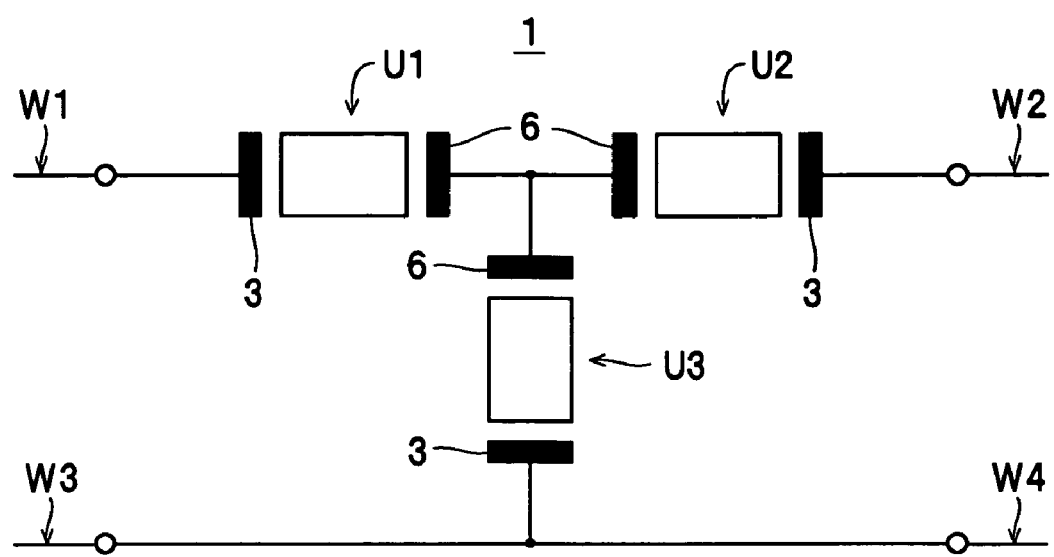
FIG. 3 is an equivalent circuit diagram of the piezoelectric thin film resonator.

The piezoelectric thin film resonator 1 shown in FIGS. 1 and 2 corresponds to the piezoelectric thin film resonator according to the present invention, and is constructed so as to include a substrate 2, lower electrodes 3, 3, 3, a piezoelectric film 4, and an upper electrode 6. In this case, the piezoelectric thin film resonator 1 is constructed so as to include three unit piezoelectric thin film resonators U1 to U3 (hereinafter collectively referred to as a unit piezoelectric thin film resonator U when no distinction is required). Here, a unit piezoelectric thin film resonator U refers to a construction element which includes a part between a lower electrode 3 and a part of the upper electrode 6 opposite that lower electrode 3 and which functions as a resonator when driven. More specifically, a unit piezoelectric thin film resonator U is constructed of a lower electrode 3, the upper electrode 6, and the piezoelectric film 4 that includes a part sandwiched between the electrodes 3 and 6, with these unit piezoelectric thin film resonators U also respectively constructing piezoelectric thin film resonators according to the present invention. That is, the piezoelectric thin film resonator according to the present invention is constructed by one unit piezoelectric thin film resonator U as a smallest unit, and can also be constructed of a plurality of unit piezoelectric thin film resonators U. The piezoelectric thin film resonator 1 also functions as a filter as an electronic component according to the present invention, and if the three unit piezoelectric thin film resonators U1 to U3 are connected as shown in FIG. 3, the piezoelectric thin film resonator 1 can function as a series-parallel-series type filter. It should be noted that in FIG. 2 and FIGS. 5 to 31, the respective layers are illustrated with an exaggerated thickness for ease of understanding the present invention, and that the ratios of thicknesses between the respective layers differ to those used in reality.

As shown in FIG. 2, the substrate 2 is a support substrate for supporting a multilayer structure composed of the lower electrodes 3, 3, 3, the piezoelectric film 4, and the upper electrode 6, and is constructed of a silicon substrate (a bare silicon wafer) 11 formed with a thickness in a range of 100 µm to 3000 µm inclusive, and a lower barrier layer 12 and an upper barrier layer 13 respectively formed on the front and rear surfaces of the silicon substrate 11. In this case, in the piezoelectric thin film resonator 1, as one example a silicon substrate 11 formed with a thickness in a range of 200 µm to 500 µm inclusive is used, and the lower barrier layer 12 and the upper barrier layer 13 are formed with silicon nitride ($SiN_x$) or silicon oxide ($SiO_2$) in a range of 0.03 µm to 0.5 µm inclusive. Also, to prevent vibration of the lower electrodes 3, the piezoelectric film 4, and the upper electrode 6 from being absorbed by the substrate 2 when the piezoelectric thin film resonator 1 is driven, a vibration space 2a is formed in the substrate 2.

The lower electrodes 3 are formed with a metal material such as Al, Pt, Au, Ag, Cr, Cu, or Ti with a thickness in a range of 0.03 µm to 1 µm inclusive. In this case, in the piezoelectric thin film resonator 1, as described later and shown in FIG. 11, as one example a thin film of chromium (Cr) is formed as a bonding layer 3a on the substrate 2, on whose upper surface a mask M2 has been formed, an electrode material layer 3b made of gold (Au) is then formed, and after this the mask M2 is then removed (i.e., a lift off method is used) to form the lower electrodes 3. It should be noted that as the metal material used to form the lower electrodes 3 and the upper electrode 6 described later, in a case where ripples during driving are to be reduced, a metal material with a low Poisson's ratio and a low density (such as aluminum) should preferably be used. Also, when insertion loss for passing signals is to be reduced, a low resistance metal material (such as gold) should preferably be used. The piezoelectric film 4 is a thin layer with piezoelectric characteristics that is formed with zinc oxide (ZnO), lead zirconate titanate (Pb $(Zr, Ti)O_3$, also known as "PZT"), aluminum nitride (AlN), or the like, and is formed with a thickness of 5 µm or less. In this case, in the piezoelectric thin film resonator 1, as one example the piezoelectric film 4 is formed with zinc oxide (ZnO), which is known for its relatively high coupling coefficient, with a thickness of around 0.8 µm. Also, in the piezoelectric thin film resonator 1, four through-holes 7, 7, 7, 7 are formed so as to pass through the piezoelectric film 4, and as shown in FIG. 3, bonding wires W1 to W4 or the like can be connected (bonded) to the surface of the lower electrodes 3.

In the same way as the lower electrodes 3, the upper electrode 6 is formed with a metal such as Al, Pt, Au, Ag, Cr, Cu, or Ti in a thin film with a thickness in a range of 0.03 µm to 1 µm inclusive. In this case, in the piezoelectric thin film resonator 1, as described later and shown in FIG. 15, as one example a thin film of chromium (Cr) is formed as the bonding layer 6a on the piezoelectric film 4, on whose upper surface a mask M3 has been formed, an electrode material layer 6b made of gold (Au) is then formed, and after this the mask M3 is removed (i.e., a lift off method is used) to form the upper electrode 6.

Next, the construction of a piezoelectric thin film resonator manufacturing apparatus 51 that manufactures the piezoelectric thin film resonator 1 will be described with reference to the drawings.

Figure 4:
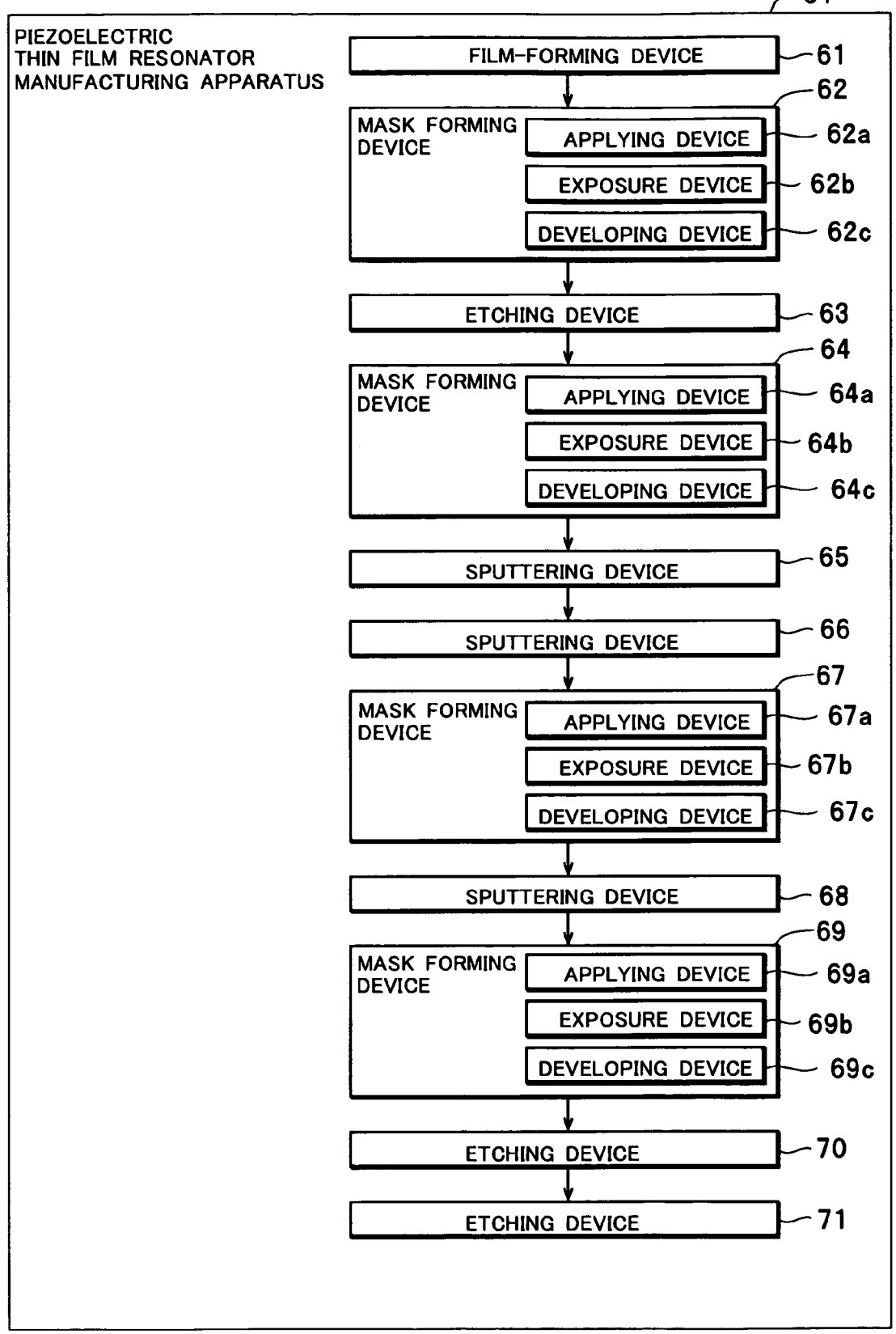
FIG. 4 is a block diagram showing the construction of a piezoelectric thin film resonator manufacturing apparatus that manufactures a piezoelectric thin film resonator.

The piezoelectric thin film resonator manufacturing apparatus (hereinafter simply "manufacturing apparatus") 51 shown in FIG. 4 is a manufacturing apparatus for manufacturing the piezoelectric thin film resonator 1, and is constructed so as to include a film-forming device 61, mask forming devices 62, 64, 67, and 69, etching devices 63, 70, and 71, and sputtering devices 65, 66, and 68. The film-forming device 61 attaches silicon nitride ($SiN_x$), for example, by chemical vapor deposition onto both front and rear surfaces of the silicon substrate 11 to form the lower barrier layer 12 and the upper barrier layer 13. The mask forming device 62 includes an applying device 62a, an exposure device 62b, and a development device 62c, and forms a mask M1 (see FIG. 8) on a lower surface of the lower barrier layer 12. The etching device 63 etches the lower barrier layer 12 by reactive ion etching, for example. The mask forming device 64 includes an applying device 64a, an exposure device 64b, and a development device 64c, and forms a mask M2 (see FIG. 10) on an upper surface of the upper barrier layer 13 on the substrate 2. As shown in FIG. 11, the sputtering device 65 forms the bonding layer 3a and the electrode material layer 3b by forming layers of chromium (Cr) and gold (Au) in order on the upper surface of the upper barrier layer 13 on which the mask M2 has been formed.

After formation of the bonding layer 3a and the electrode material layer 3b by the sputtering device 65, the sputtering device 66 forms the piezoelectric film 4 by forming a layer of zinc oxide (ZnO), for example, on the upper barrier layer 13 so as to cover the lower electrodes 3 (see FIG. 12) that have been formed on the substrate 2 by removing the mask M2. The mask forming device 67 includes an applying device 67a, an exposure device 67b, and a development device 67c, and forms a mask M3 (see FIG. 14) on the piezoelectric film 4. The sputtering device 68 forms the bonding layer 6a and the electrode material layer 6b by forming layers of chromium (Cr) and gold (Au) in order on the piezoelectric film 4 on which the mask M3 has been formed. The mask forming device 69 includes an applying device 69a, an exposure device 69b, and a development device 69c, and forms, after formation of the bonding layer 6a and the electrode material layer 6b by the sputtering device 68, a mask M4 (see FIG. 17) on the piezoelectric film 4 so as to cover the upper electrode 6 (see FIG. 16) that has been formed on the piezoelectric film 4 by removing the mask M3. The etching device 70 etches the piezoelectric film 4 by wet etching using acetic acid, for example, to form the through-holes 7, 7, 7, 7, and the etching device 71 etches the silicon substrate 11 by wet etching using potassium hydroxide (KOH), for example, to form the vibration space 2a.

Next, the method of manufacturing the piezoelectric thin film resonator 1 will be described with reference to the drawings.

Figure 9:
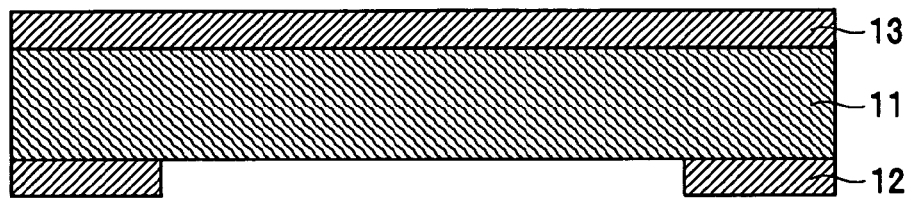
FIG. 9 is a cross-sectional view of a state where the lower barrier layer has been etched using the mask.

First, as shown in FIG. 5, the film-forming device 61 attaches silicon nitride ($SiN_x$) to the front and rear surfaces of the silicon substrate 11 to form the lower barrier layer 12 and the upper barrier layer 13. Next, as shown in FIG. 6, the applying device 62a of the mask forming device 62 applies a positive-type photoresist, for example, to form a resist layer R1 on a lower surface of the lower barrier layer 12. After this, as shown in FIG. 7, in a state where a glass mask 21 on whose surface a mask pattern 21a is formed by chromium (Cr), for example, has been brought into tight contact with the resist layer R1, the exposure device 62b irradiates UV rays in the direction shown by the arrow in FIG. 7 to form a latent image in (i.e., expose) the resist layer R1. Next, the development device 62c develops the resist layer R1 in this state to form the mask M1 on the lower surface of the lower barrier layer 12 as shown in FIG. 8. After this, the etching device 63 etches the lower barrier layer 12. By doing so, as shown in FIG. 9, a central part of the lower barrier layer 12 (the part where the vibration space 2a will be formed later) is removed.

Figure 10:
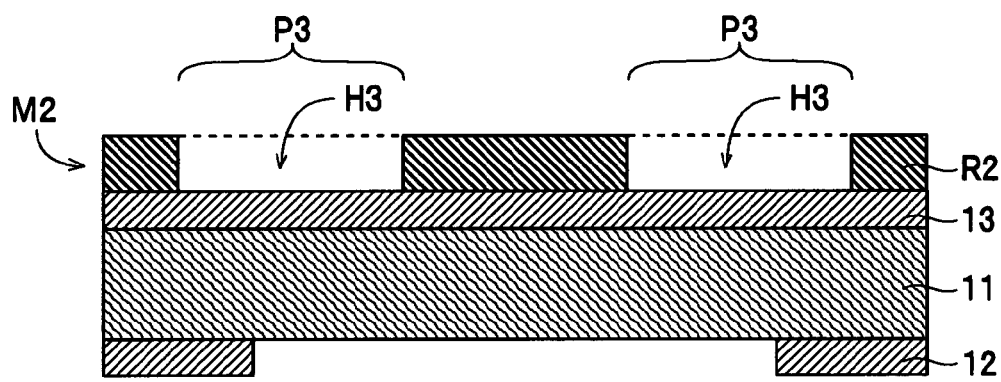
FIG. 10 is a cross-sectional view of a state where a mask has been formed on an upper surface of the upper barrier layer.
Figure 11:
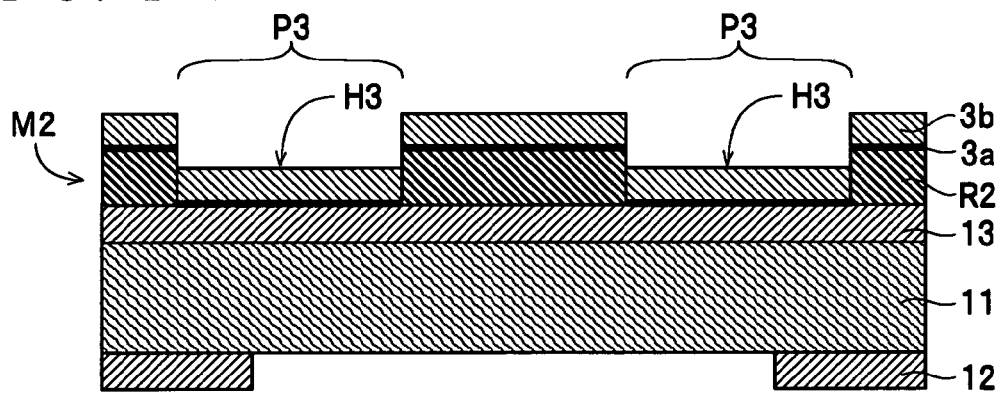
FIG. 11 is a cross-sectional view of a state where a bonding layer and an electrode material layer have been formed on the mask and on the upper barrier layer.
Figure 12:
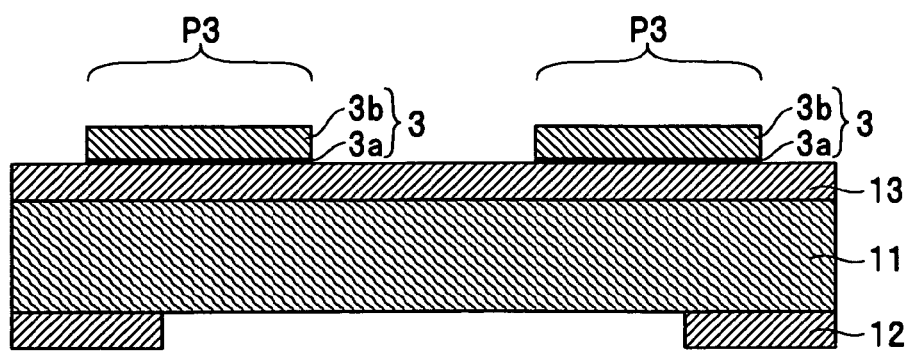
FIG. 12 is a cross-sectional view of a state where lower electrodes have been formed on the upper barrier layer by removing the mask using a resist stripping chemical.
Figure 13:
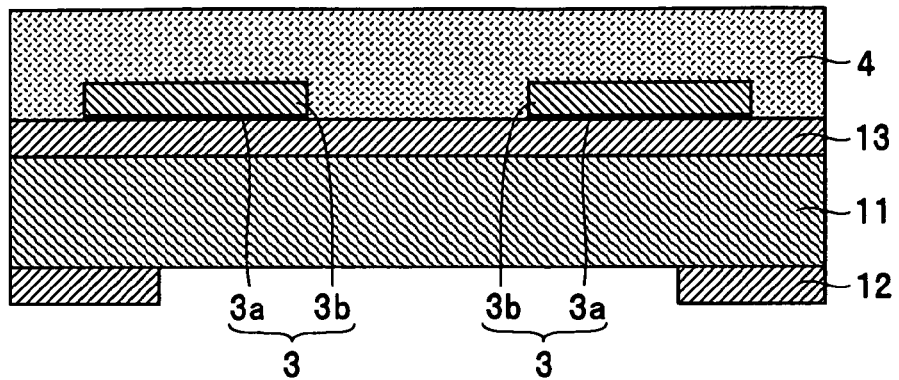
FIG. 13 is a cross-sectional view of a state where a piezoelectric film has been formed so as to cover the lower electrodes.

Next, as shown in FIG. 10, the applying device 64a of the mask forming device 64 applies a photoresist onto the upper barrier layer 13 to form the resist layer R2. The resist layer R2 is then exposed by the exposure device 64b and developing is carried out by the development device 64c to form exposure holes H3, which enable formation parts P3 of the lower electrodes 3 to be exposed, in the resist layer R2, thereby forming the mask M2 on the upper barrier layer 13. Next, as shown in FIG. 11, the sputtering device 65 forms layers of chromium (Cr) and gold (Au) on the mask M2 and the upper barrier layer 13 exposed via the mask M2, thereby forming the bonding layer 3a with a thickness of around 10 nm and the electrode material layer 3b with a thickness of around 100 nm. After this, the multilayer structure in this state is soaked in a resist stripping chemical to remove the mask M2 from the upper barrier layer 13. At this time, the bonding layer 3a and the electrode material layer 3b formed on the mask M2 are removed from above the upper barrier layer 13 together with the mask M2, so that as shown in FIG. 12, the lower electrodes 3 are formed on the upper barrier layer 13. At this time, the resist stripping chemical for removing the mask M2 hardly corrodes the substrate 2 (the upper barrier layer 13), so that it is possible to sufficiently soak the multilayer structure in the resist stripping chemical in order to completely remove parts of the electrode material layer 3b and the bonding layer 3a to be removed together with the mask M2. As a result, only the required lower electrodes 3 can be formed on the substrate 2 without unnecessary parts of the electrode material layer 3b and the like being left. It should be noted that when the mask M2 is stripped or the mask M3 is stripped as described later, it is possible to promote the stripping of the resist (mask) by using an ultrasonic cleaner, for example. Next, as shown in FIG. 13, the sputtering device 66 forms a layer of zinc oxide (ZnO), for example, on the upper barrier layer 13 so as to cover the lower electrodes 3, thereby forming the piezoelectric film 4 with a thickness of around 0.8 µm.

Figure 14:
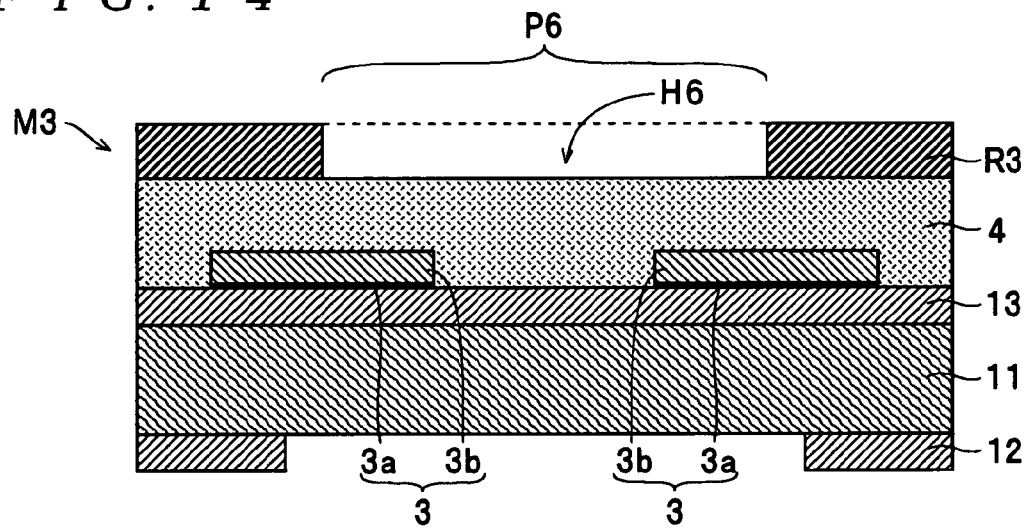
FIG. 14 is a cross-sectional view of a state where a mask has been formed on an upper surface of the piezoelectric film.
Figure 15:
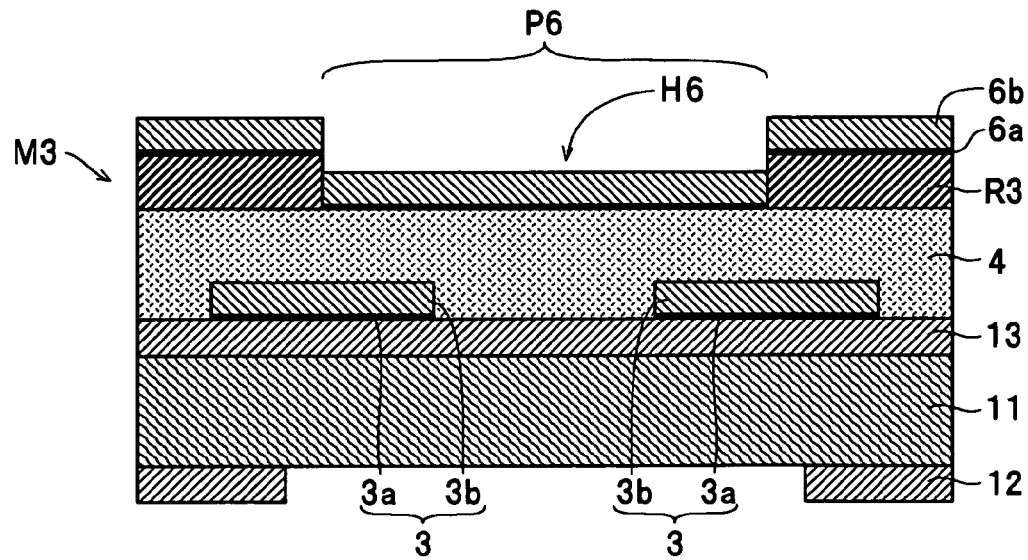
FIG. 15 is a cross-sectional view of a state where a bonding layer and an electrode material layer have been formed on the mask and on the piezoelectric film.
Figure 16:
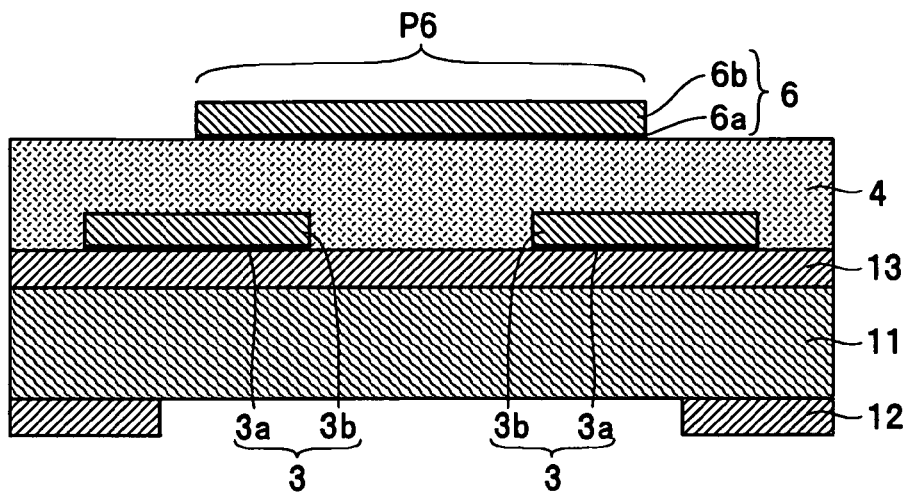
FIG. 16 is a cross-sectional view of a state where an upper electrode has been formed on the piezoelectric film by removing the mask using a resist stripping chemical.

Next, as shown in FIG. 14, after forming the resist layer R3 on the piezoelectric film 4 by applying a photoresist, the mask forming device 67 carries out exposure and development to form an exposure hole H6, which enables a formation part P6 of the upper electrode 6 to be exposed, in the resist layer R3, thereby forming the mask M3 on the piezoelectric film 4. Next, as shown in FIG. 15, the sputtering device 68 forms layers of chromium (Cr) and gold (Au), for example, in order on the mask M3 and the piezoelectric film 4 exposed via the mask M3, thereby forming the bonding layer 6a that is around 10 nm thick and the electrode material layer 6b that is around 100 nm thick. After this, the multilayer structure in this state is soaked in a resist stripping chemical to remove the mask M3 from the piezoelectric film 4. At this time, the bonding layer 6a and the electrode material layer 6b formed on the mask M3 are removed from above the piezoelectric film 4 together with the mask M3, so that as shown in FIG. 16, the upper electrode 6 is formed on the piezoelectric film 4. At this time, the resist stripping chemical for removing the mask M3 does not significantly corrode the piezoelectric film 4, so that it is possible to sufficiently soak the multilayer structure in the resist stripping chemical in order to completely remove parts of the electrode material layer 6b and the bonding layer 6a to be removed together with the mask M3. As a result, only the required upper electrode 6 can be formed on the piezoelectric film 4 without unnecessary parts of the electrode material layer 6b and the like being left.

Figure 17:
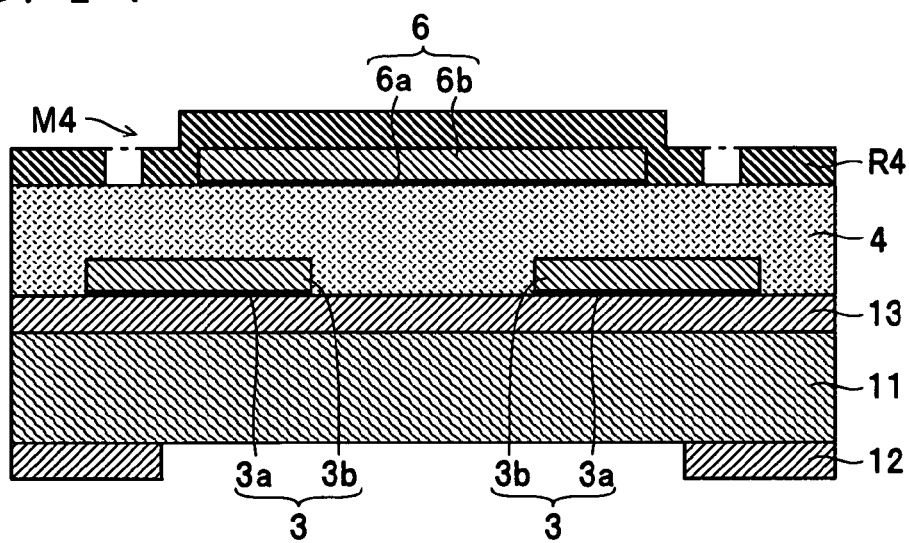
FIG. 17 is a cross-sectional view of a state where a mask has been formed so as to cover the upper electrode.
Figure 18:
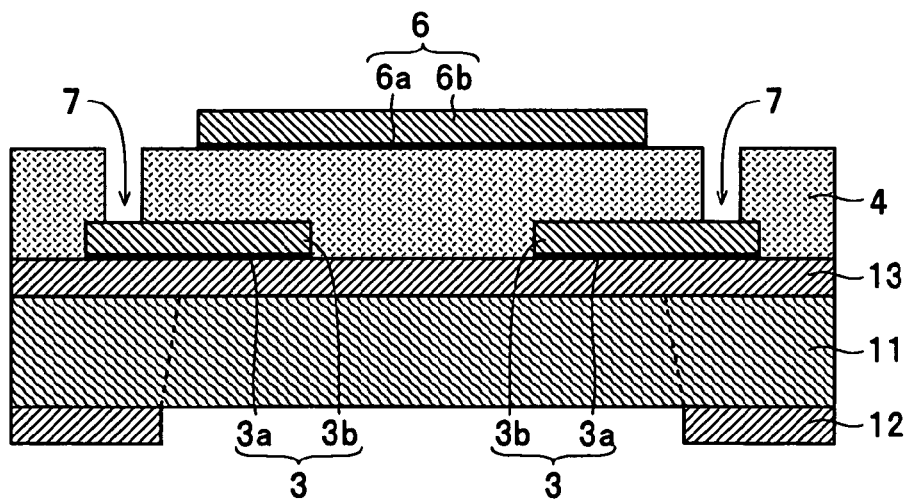
FIG. 18 is a cross-sectional view of a state where the piezoelectric film has been etched using the mask to form through-holes.

Next, as shown in FIG. 17, after applying a photoresist onto the piezoelectric film 4 so as to cover the upper electrode 6 and thereby form a resist layer R4, the mask forming device 69 carries out exposure and development to form the mask M4 on the piezoelectric film 4. Next, as shown in FIG. 18, the etching device 70 etches the piezoelectric film 4 to form the through-holes 7, 7, 7, 7. Next, the etching device 71 etches the silicon substrate 11 with the lower barrier layer 12 formed on the lower surface of the silicon substrate 11 as a mask. By doing so, the part shown by the broken line in FIG. 18 is removed to form the vibration space 2a, resulting in the piezoelectric thin film resonator 1 shown in FIG. 2 being completed.

In this way, according to the method of manufacturing the piezoelectric thin film resonator 1 using the manufacturing apparatus 51, by forming the upper electrode 6 by forming the bonding layer 6a and the electrode material layer 6b on the mask M3 formed on the piezoelectric film 4 and the piezoelectric film 4 exposed via the exposure hole H6 and then soaking in the resist stripping chemical to remove the mask M3 (i.e., by forming the upper electrode 6 by a lift off method), it is possible when forming the upper electrode 6 to dispense with a step of etching that corrodes the piezoelectric film 4. Accordingly, it is possible to avoid problems such as fluctuations in the thickness of the piezoelectric film 4 or parts of the bonding layer 6a, the electrode material layer 6b, and the like remaining on the piezoelectric film 4, so that a piezoelectric thin film resonator 1 with the desired electrical characteristics can be easily and reliably manufactured. In addition, by constructing an electronic component, such as a filter, using this piezoelectric thin film resonator 1, it is possible to provide an electronic component that satisfies the desired electrical characteristics.

Also, according to the method of manufacturing the piezoelectric thin film resonator 1 using the manufacturing apparatus 51, by forming the lower electrodes 3 by forming the bonding layer 3a and the electrode material layer 3b on the mask M2 formed on the substrate 2 and the substrate 2 (the upper barrier layer 13) exposed via the exposure holes H3 and then soaking in the resist stripping chemical to remove the mask M2 (i.e., by forming the lower electrodes 3 by a lift off method), it is possible when forming the lower electrodes 3 to dispense with a step of etching that corrodes the substrate 2. Accordingly, it is possible to avoid problems such as fluctuations in the thickness of the substrate 2 or parts of the bonding layer 3a, the electrode material layer 3b, and the like remaining on the substrate 2, so that a piezoelectric thin film resonator 1 with the desired electrical characteristics can be easily and reliably manufactured. In this case, by forming both the lower electrodes 3 and the upper electrode 6 using a lift off method, a piezoelectric thin film resonator 1 with the desired electrical characteristics can be manufactured more reliably.

In addition, according to the method of manufacturing the piezoelectric thin film resonator 1 using the manufacturing apparatus 51, by forming the piezoelectric film 4 of ZnO that has a relatively high coupling coefficient, it is possible to manufacture a piezoelectric thin film resonator 1 with a large passing bandwidth as filter characteristics. In this case, according to this method of manufacturing, since etching liquid is not used, even in the case where the piezoelectric film 4 is formed using ZnO that is easily corroded by acid, such as acetic acid, phosphoric acid, and nitric acid, included in an etching liquid, a piezoelectric thin film resonator 1 with the desired electrical characteristics can be easily and reliably manufactured.

Also, according to the method of manufacturing the piezoelectric thin film resonator 1 using the manufacturing apparatus 51, by forming the electrode material layer 6b using gold that has superior conductivity, it is possible to manufacture a piezoelectric thin film resonator 1 with a low insertion loss for passing signals.

Next, another method of manufacturing the piezoelectric thin film resonator 1 will be described with reference to the drawings.

Figure 19:
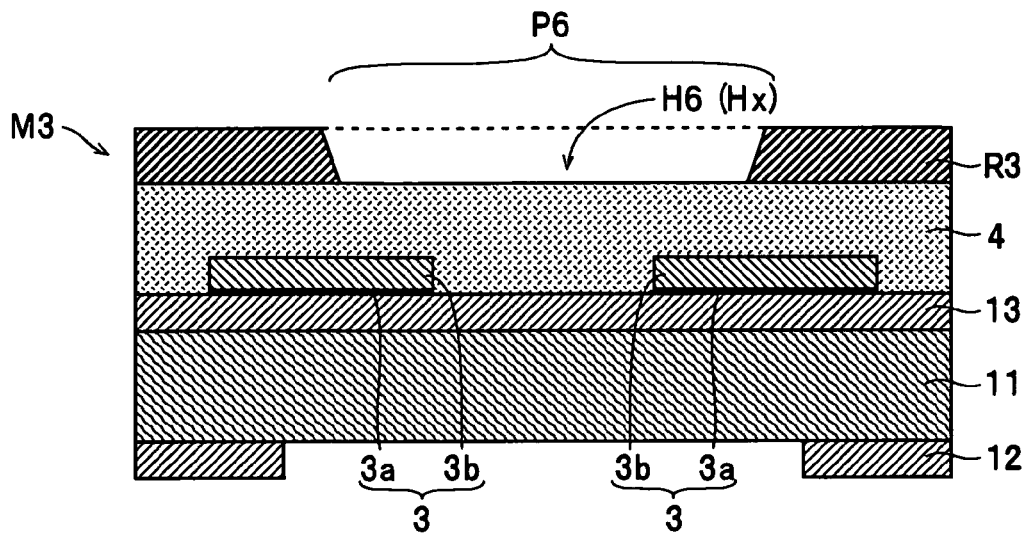
FIG. 19 is a cross-sectional view of a state where a mask has been formed on the piezoelectric film.
Figure 20:
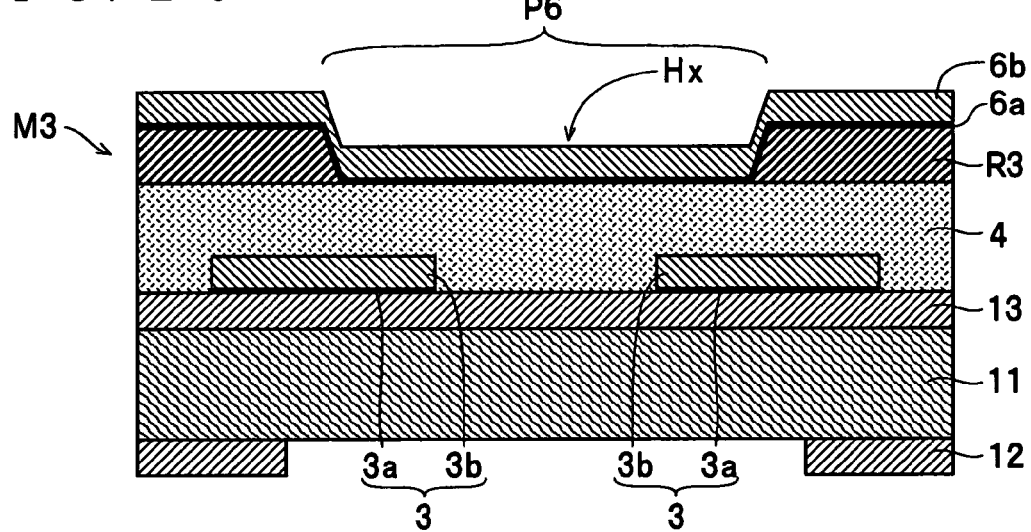
FIG. 20 is a cross-sectional view of a state where a bonding layer and an electrode material layer have been formed on the mask and the piezoelectric film in the state shown in FIG. 19.
Figure 21:
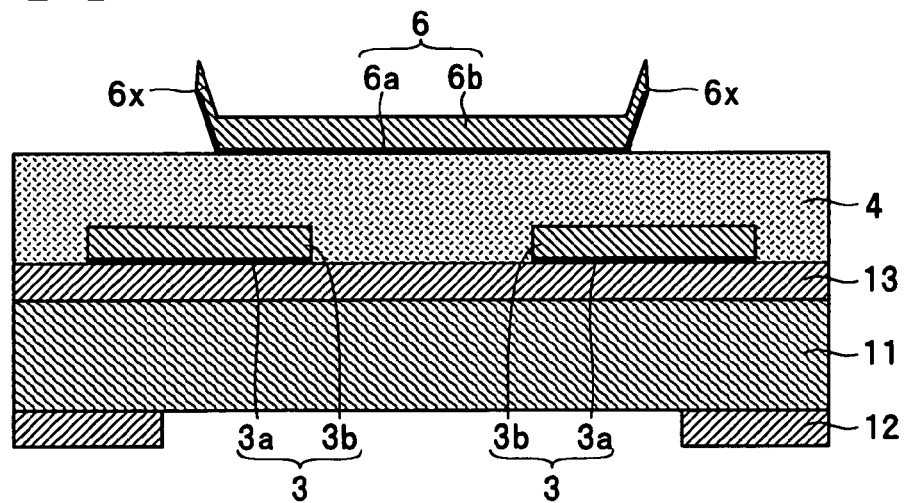
FIG. 21 is a cross-sectional view of a state where the upper electrode has been formed on the piezoelectric film by removing the mask shown in FIG. 20 using a resist stripping chemical.

According to the method of manufacturing the piezoelectric thin film resonator 1 using the manufacturing apparatus 51 described above, the upper electrode 6 is formed by the mask forming device 67 forming the mask M3 on the piezoelectric film 4, the sputtering device 68 next forming the bonding layer 6a and the electrode material layer 6b, and then soaking in the resist stripping chemical to remove the mask M3. In this case, when the resist layer R3 is formed by the applying device 67a, when a normal positive-type resist material is used as the material forming the mask, there are cases where a positive-sloped latent image is formed in the resist layer R3 when irradiation (exposure) with UV rays is carried out by the exposure device 67b. As a result, as shown in FIG. 19, when developing has been carried out by the development device 67c, an exposure hole H6 whose side walls are positively sloped is formed (hereinafter, an exposure hole H6 in this state is referred to as an "exposure hole Hx"). When the bonding layer 6a and the electrode material layer 6b are formed on the mask M3 in this state and the piezoelectric film 4 exposed via the exposure hole Hx, as shown in FIG. 20, layers of chromium (Cr) and gold (Au) are also formed on the side walls of the exposure hole Hx, so that the electrode material layer 6b and the bonding layer 6a on the mask M3 are sometimes joined to the bonding layer 6a and the electrode material layer 6b (on the piezoelectric film 4) inside the exposure hole Hx. If the soaking in the resist stripping chemical is carried out in this state to remove the mask M3, due to the inability to sufficiently soak the mask M3 in the resist stripping chemical, there is the risk of the stripping (removal) of the mask M3 being impeded and, as shown in FIG. 21, the risk of burrs 6x (residue of the bonding layer 6a and the electrode material layer 6b formed in layers on the side walls of the exposure hole H6) being formed at ends of the upper electrode 6. It would therefore be preferable to avoid such problems.

Figure 22:
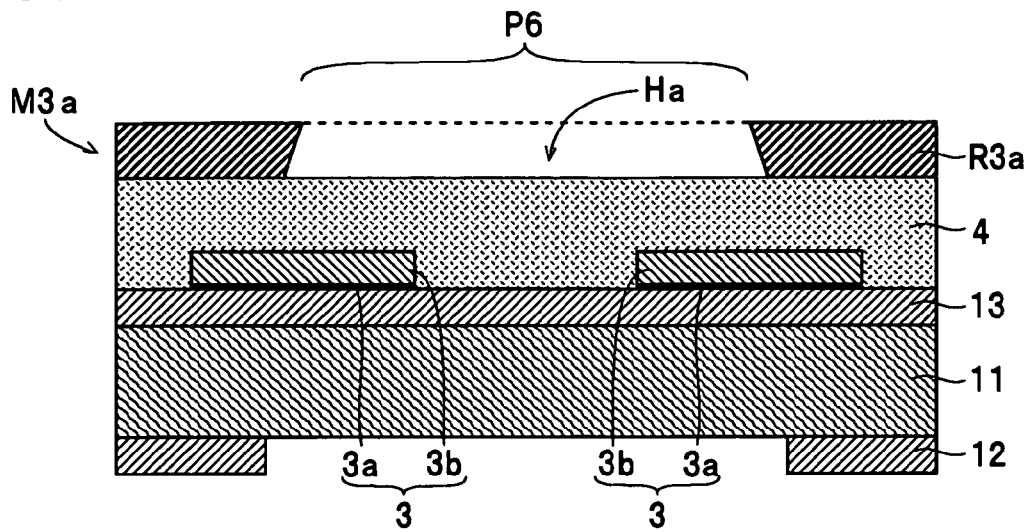
FIG. 22 is a cross-sectional view of a state where a mask has been formed on an upper surface of the piezoelectric film according to a method of manufacturing according to another embodiment of the present invention.

Accordingly, as shown in FIG. 22, first the mask forming device 67 uses a photoresist (AZ5200E series) made by Clariant Japan K.K., for example, to form a resist layer R3a on the piezoelectric film 4 and then carries out exposure and development to form an exposure hole Ha in the resist layer R3a, thereby forming a mask M3a on the piezoelectric film 4. In this case, a latent image with a negative slope is formed in the photoresist used to form the resist layer R3a when irradiation with UV rays (exposure) is carried out. Accordingly, when this resist layer R3a is developed, as shown in FIG. 22, a negative-sloped exposure hole Ha is formed where an upper surface side of the resist layer R3a in the thickness direction (that is, the surface upon which the bonding layer 6a and the electrode material layer 6b will be formed) protrudes inwards (that is, above the formation part P6 of the upper electrode 6) at the rim of the exposure hole Ha.

Figure 23:
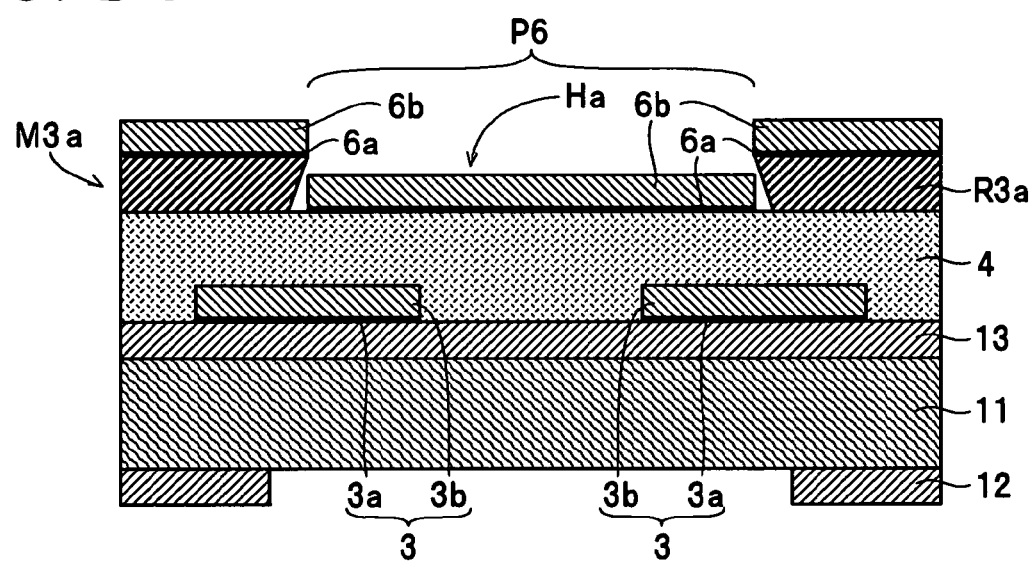
FIG. 23 is a cross-sectional view of a state where a bonding layer and an electrode material layer have been formed on a piezoelectric film and a mask according to a method of manufacturing according to another embodiment of the present invention.

Next, as shown in FIG. 23, the sputtering device 68 forms layers of chromium (Cr) and gold (Au), for example, in order on the mask M3a and the piezoelectric film 4 exposed via the mask M3a, thereby forming the bonding layer 6a and the electrode material layer 6b in order. At this time, since the side walls of the exposure hole Ha formed in the mask M3a are negatively sloped, the problem of layers of chromium (Cr) and gold (Au) being formed on these side walls is avoided, so that the bonding layer 6a and the electrode material layer 6b on the mask M3a are formed separately to the bonding layer 6a and the electrode material layer 6b formed on the piezoelectric film 4 inside the exposure hole Ha. After this, by soaking in resist stripping chemical to remove the mask M3a, the upper electrode 6 is formed on the piezoelectric film 4, and then the formation of the through-holes 7, 7, 7, 7 and the formation of the vibration space 2a are carried out in order, thereby completing the piezoelectric thin film resonator 1 shown in FIG. 2. According to this method of manufacturing, the mask M3a is formed by forming an exposure hole Ha with negative-sloped side walls in the resist layer R3a, so that when the bonding layer 6a and the electrode material layer 6b are formed by the sputtering device 68, the problem of the bonding layer 6a and the electrode material layer 6b being formed on the side walls of the exposure hole Ha can be avoided. Accordingly, when the mask M3a is removed by soaking in the resist stripping chemical, it is possible to sufficiently soak the mask M3a in the resist stripping chemical and as a result the mask M3a can be reliably stripped (removed) and the problem of burrs 6x being formed at ends of the upper electrode 6 can be reliably avoided.

In this case, in the same way as the method of forming the upper electrode 6 using the mask M3a, it is also possible to form the lower electrodes 3 using a mask composed of a resist layer formed using a resist material in which a negative-sloped latent image is formed when irradiation is carried out with UV rays. According to this method of manufacturing when the bonding layer 3a and the electrode material layer 3b are formed, it is possible to avoid the problem of the bonding layer 3a and the electrode material layer 3b being formed on the side walls of the exposure holes for forming the lower electrodes. Accordingly, when the mask for forming the lower electrodes is removed by soaking in the resist stripping chemical, it is possible to sufficiently soak the mask in the resist stripping chemical, and as a result the mask can be reliably stripped (removed) and the problem of burrs being formed at ends of the lower electrodes 3 can be reliably avoided.

Figure 24:
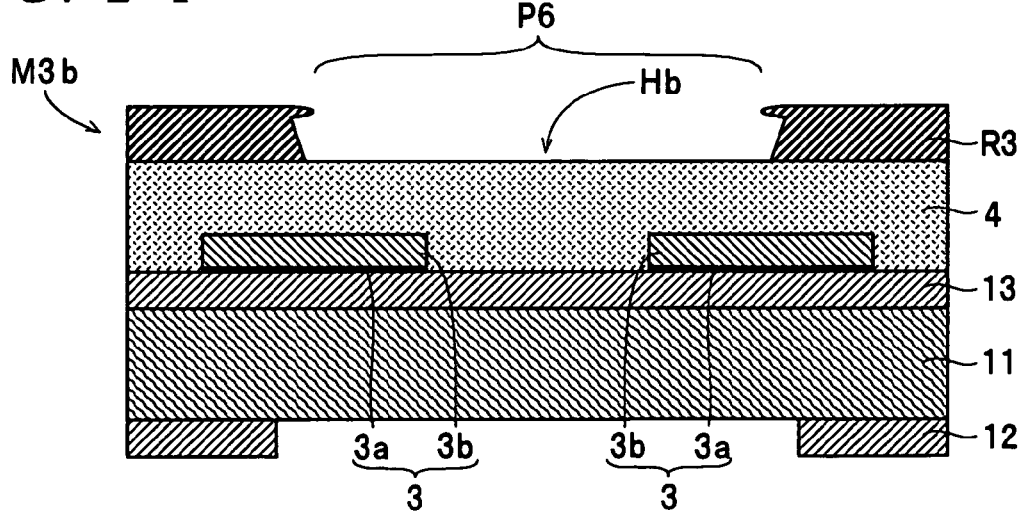
FIG. 24 is a cross-sectional view of a state where a mask has been formed by softening a surface of a resist layer using a benzene-type solvent according to a method of manufacturing according to another embodiment of the present invention.

On the other hand, it is possible to obtain the same effect as the method of manufacturing described above using a normal positive-type resist material, unlike the mask M3a formed in the method of manufacturing described above. More specifically, first the applying device 67a of the mask forming device 67 forms the resist layer R3 on the piezoelectric film 4 using a positive-type resist material. Next, the resist layer R3 in this state is subjected to a surface treatment by soaking in chlorobenzene (one example of a "benzene-type solvent" for the present invention). In this case, instead of chlorobenzene, it is possible to use a variety of benzene-type solvents, such as bromobenzene. After this, the exposure device 67b of the mask forming device 67 exposes the resist layer R3 that has been surface treated and the development device 67c carries out developing. At this time, as shown in FIG. 24, the upper surface of the resist layer R3 in the thickness direction that has been surface treated with chlorobenzene (that is, a formation surface on which the bonding layer 6a and the electrode material layer 6b will be formed) is deformed so as to protrude inwards (that is above the formation part P6 of the upper electrode 6) at the rim of the exposure hole Hb, so that the mask M3b in which the exposure hole Hb has been formed is formed on the piezoelectric film 4.

Figure 25:
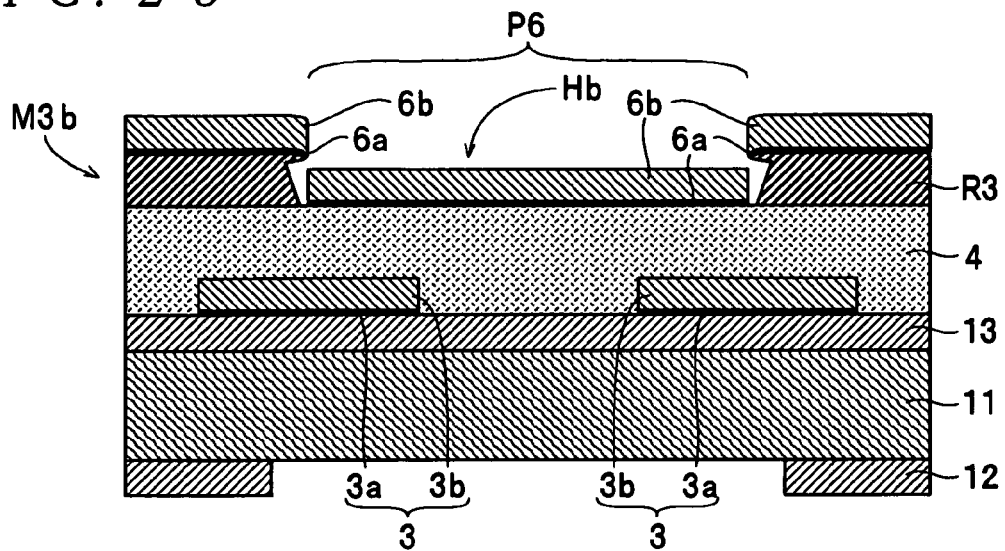
FIG. 25 is a cross-sectional view of a state where a bonding layer and an electrode material layer have been formed on a piezoelectric film and a mask according to a method of manufacturing according to another embodiment of the present invention.

Next, as shown in FIG. 25, the sputtering device 68 forms layers of chromium (Cr) and gold (Au), for example, in order on the mask M3b and the piezoelectric film 4 exposed via the mask M3b, thereby forming the bonding layer 6a and the electrode material layer 6b in that order. At this time, since the rim part of the exposure hole Hb formed in the mask M3b protrudes above the formation part P6 of the upper electrode 6 on the piezoelectric film 4, the problem of layers of chromium (Cr) and gold (Au) being formed on the side walls of the exposure hole Hb is avoided, so that the bonding layer 6a and the electrode material layer 6b are formed on the mask M3b separately to the bonding layer 6a and the electrode material layer 6b formed on the piezoelectric film 4 inside the exposure hole Hb. After this, by soaking in resist stripping chemical to remove the mask M3b, the upper electrode 6 is formed on the piezoelectric film 4, and then the formation of the through-holes 7, 7, 7, 7 and the formation of the vibration space 2a are carried out in order, thereby completing the piezoelectric thin film resonator 1 shown in FIG. 2 in the same way as the method of manufacturing that forms the mask M3a described above. According to this method of manufacturing, the formed resist layer R3 is surface treated by being soaked in a benzene-type solvent (in this case, chlorobenzene) before the exposure hole Hb is formed, thereby forming the mask M3b, so that it is possible, without using a special resist material, to reliably strip (remove) the mask M3b when forming the upper electrode 6 and the problem of burrs 6x being formed at ends of the upper electrode 6 can be reliably avoided.

Figure 26:
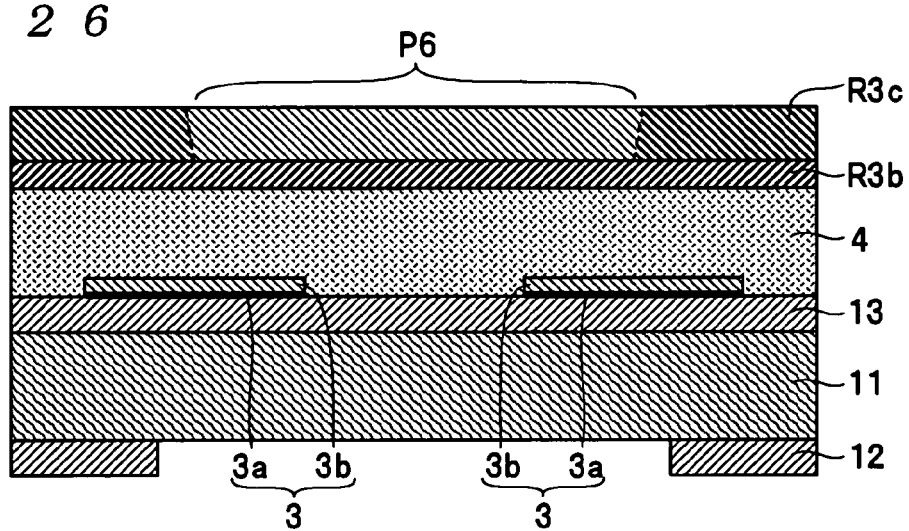
FIG. 26 is a cross-sectional view of a state where a resist layer has been formed on an upper surface of a piezoelectric film according to a method of manufacturing according to another embodiment of the present invention.
Figure 27:
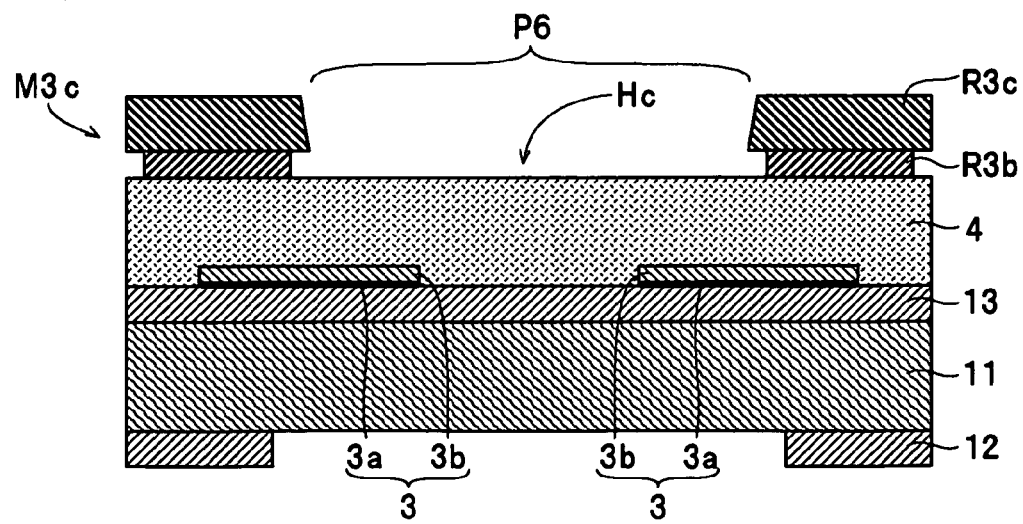
FIG. 27 is a cross-sectional view of a state where a mask has been formed by developing the resist layer according to a method of manufacturing according to another embodiment of the present invention.

Also, in place of the masks M3, M3a, M3b formed in the above-described methods of manufacturing, it is possible to use a method of manufacturing that forms a mask M3c (see FIG. 27) composed of two resist layers R3b, R3c. More specifically, first a positive-type resist material that has been subjected to an exposure process in advance is applied onto the piezoelectric film 4 to form the resist layer R3b (the "first resist layer" for the present invention; see FIG. 26). At this time, after a normal positive-type resist material has been applied, the resist layer R3b can be formed by exposing the entire resist material. By doing so, a resist layer R3b that can be dissolved in a developer liquid is formed on the piezoelectric film 4. Next, after the resist layer R3b in this state has been pre-baked, as shown in FIG. 26 a positive-type resist material is applied so as to cover the resist layer R3b, thereby forming the resist layer R3c (the "second resist layer" for the present invention). Next, by exposing the resist layer R3c in this state after pre-baking, a latent image is formed above the formation part P6 in the resist layer R3c. After this, the resist layers R3b, R3c in this state are soaked in developer liquid. At this time, as shown in FIG. 27, first the part of the resist layer R3c in which the latent image has been formed (the exposed part) is dissolved in the developer liquid, and next, the part of the resist layer R3b that was covered by the part of the resist layer R3c that has been dissolved is dissolved in the developer liquid. By doing so, a mask M3c with an exposure hole Hc that passes through both resist layers R3b, R3c and can expose the formation part P6 of the upper electrode 6 on the piezoelectric film 4 is formed on the piezoelectric film 4. In this case, the mask M3c is formed so that an upper surface in the thickness direction (that is, a formation surface on which the bonding layer 6a and the electrode material layer 6b will be formed) protrudes inwards (that is, above the formation part P6 of the upper electrode 6) at a rim of the exposure hole Hc (an opening formed in the resist layer R3c).

Figure 28:
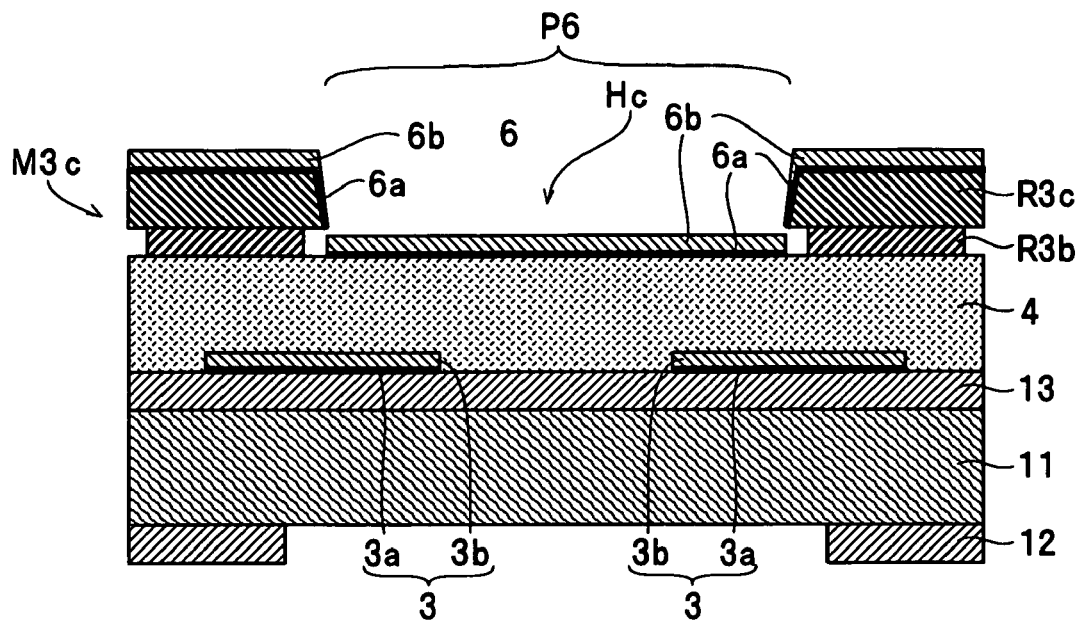
FIG. 28 is a cross-sectional view of a state where a bonding layer and an electrode material layer have been formed on a mask and a piezoelectric film according to a method of manufacturing according to another embodiment of the present invention.
Figure 29:
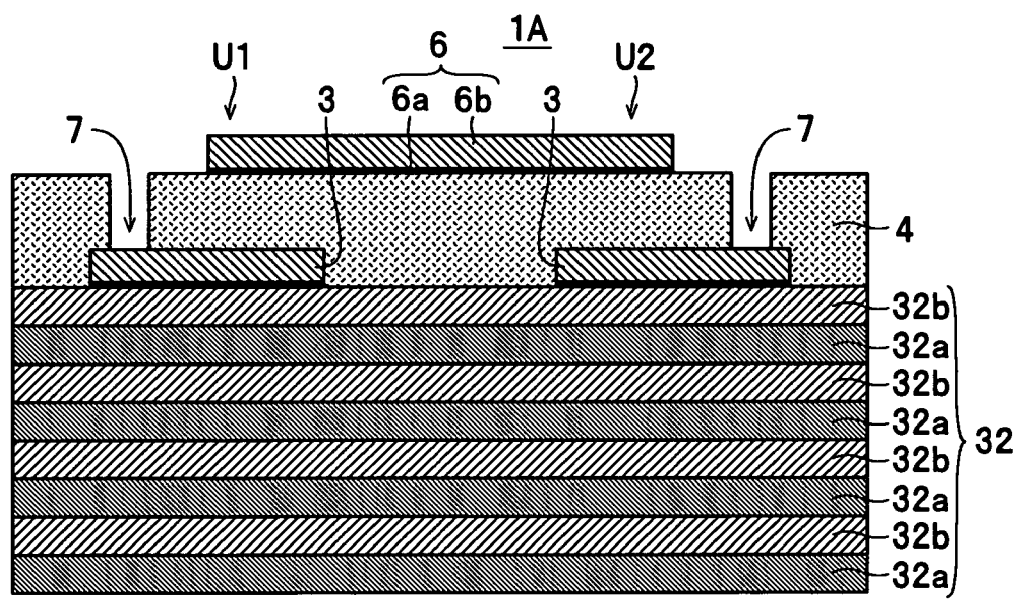
FIG. 29 is a cross-sectional view of a layered construction of a piezoelectric thin film resonator manufactured according to a method of manufacturing according to another embodiment of the present invention.

Next, as shown in FIG. 28, the sputtering device 68 forms layers of chromium (Cr) and gold (Au), for example, in order on the mask M3c and the piezoelectric film 4 exposed via the mask M3c, thereby forming the bonding layer 6a and the electrode material layer 6b in order. At this time, since the rim part (the opening formed in the resist layer R3c) of the exposure hole Hc formed in the mask M3c protrudes above the formation part P6 of the upper electrode 6 on the piezoelectric film 4, the bonding layer 6a and the electrode material layer 6b are formed on the mask M3c separately to the bonding layer 6a and the electrode material layer 6b formed on the piezoelectric film 4 inside the exposure hole Hc. After this, by soaking in the resist stripping chemical to remove the mask M3c, the upper electrode 6 is formed on the piezoelectric film 4, and then the formation of the through-holes 7, 7, 7, 7 and the formation of the vibration space 2a are carried out in order, thereby completing the piezoelectric thin film resonator 1 shown in FIG. 2 in the same way as the method of manufacturing that forms the mask M3a described above. According to this method of manufacturing, the resist layer R3c is formed on the resist layer R3b and an exposure hole Hc with a rim part that protrudes above the formation part P6 of the upper electrode 6 is formed, so that when the upper electrode 6 is formed, the mask M3c can be reliably stripped (removed) and the problem of burrs 6x being formed at ends of the upper electrode 6 can be reliably avoided.

In this case, in the same way as the method of forming the upper electrode 6 using the masks M3b, M3c, it is possible to form the lower electrodes 3 using a mask formed so that at the rims of the exposure holes for forming the lower electrodes, an upper surface in the thickness direction protrudes inwards (i.e., above the formation parts P3 of the lower electrodes 3). According to this method of manufacturing, the bonding layer 3a and the electrode material layer 3b can be formed on the mask separately to the bonding layer 3a and the electrode material layer 3b formed on the substrate 2 inside the exposure holes, so that when the mask for forming the lower electrodes is soaked in the resist stripping chemical to remove the mask, the mask can be sufficiently soaked in the resist stripping chemical, resulting in it being possible to reliably strip (remove) the mask and to reliably avoid the problem of burrs being formed at ends of the lower electrodes.

It should be noted that the present invention is not limited to the above embodiments. For example, although methods of manufacturing in which the lower electrodes 3, the piezoelectric film 4, and the upper electrode 6 are formed on the substrate 2 composed of the silicon substrate 11, the lower barrier layer 12, and the upper barrier layer 13 have been described in the embodiments of the present invention, the structure of the substrate used in the method of manufacturing according to the present invention is not limited to this. For example, it is also possible to use a method of manufacturing that forms the lower electrodes 3, the piezoelectric film 4, and the upper electrode 6 on a substrate 32 (acoustic multilayer film) formed by alternately stacking aluminum nitride (AlN) thin films 32a and silicon oxide (SiO$_2$) thin films 32b, for example, as in the piezoelectric thin film resonator 1A shown in FIG. 29. According to this method of manufacturing, compared to the substrate 2 used in the method of manufacturing the piezoelectric thin film resonator 1 described above, the strength of the substrate 32 can be increased by an amount corresponding to the increase in thickness of the unit piezoelectric thin film resonators U, so that it is possible to manufacture a piezoelectric thin film resonator 1A where breakage due to shocks and the like can be avoided.

Figure 30:
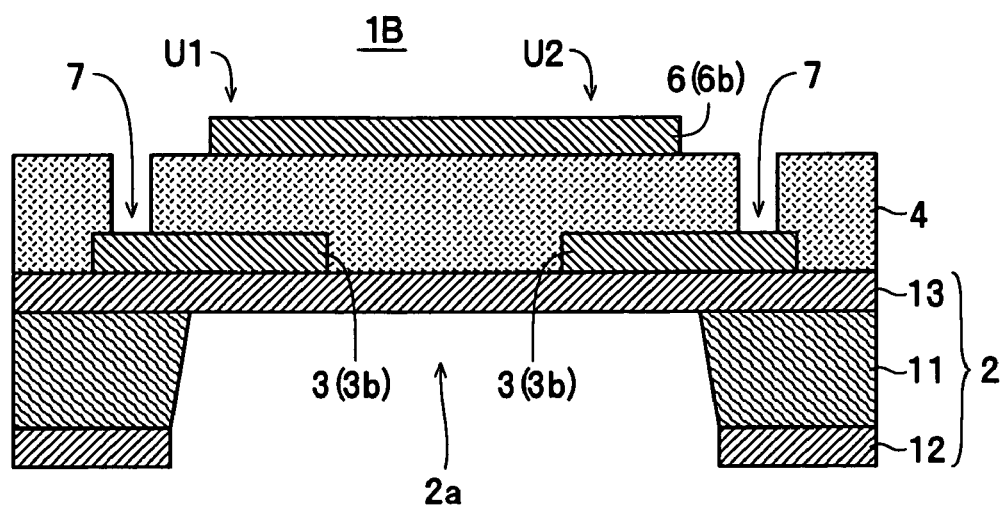
FIG. 30 is a cross-sectional view of a layered construction of a piezoelectric thin film resonator manufactured according to a method of manufacturing according to another embodiment of the present invention.
Figure 31:
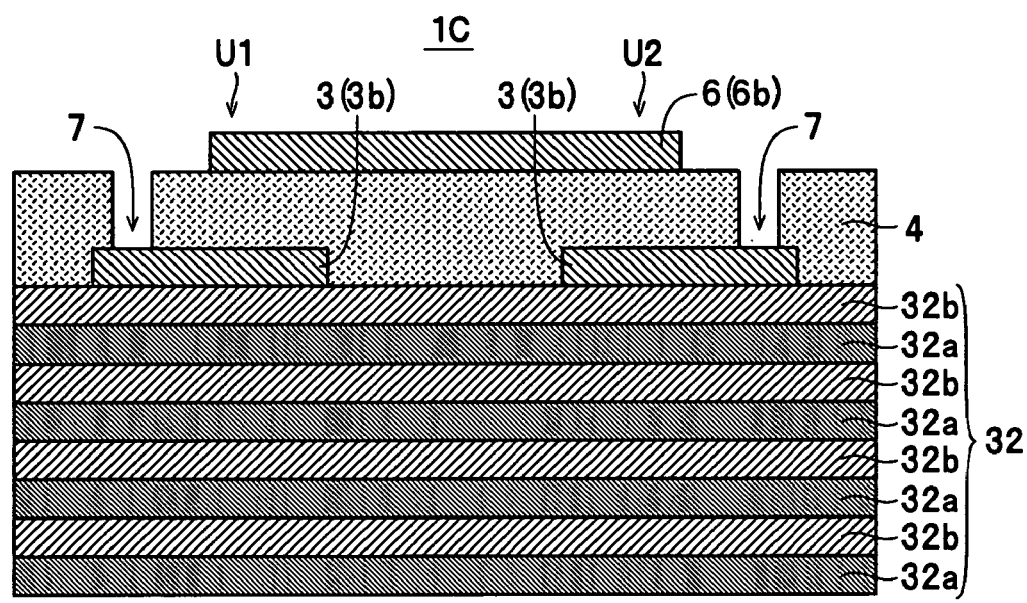
FIG. 31 is a cross-sectional view of a layered construction of a piezoelectric thin film resonator manufactured according to a method of manufacturing according to another embodiment of the present invention.

Also, although a method of manufacturing in which the sputtering device 65 forms the lower electrodes 3 by forming the bonding layer 3a by forming a layer of chromium (Cr) and then forming the electrode material layer 3b by forming a layer of gold (Au) and the sputtering device 68 forms the upper electrode 6 by forming the bonding layer 6a by forming a layer of chromium (Cr) and then forming the electrode material layer 6b by forming a layer of gold (Au) has been described in the above embodiment of the present invention, the present invention is not limited to this. For example, it is possible to use a method of manufacturing a piezoelectric thin film resonator 1B in which as shown in FIG. 30, the sputtering device 65 forms the electrode material layer 3b by forming a layer of aluminum (Al) and then forms the electrode material layer 3b on the upper barrier layer 13 by lift off, and the sputtering device 68 forms the electrode material layer 6b by forming an aluminum (Al) layer, and then forms the upper electrode 6 on the piezoelectric film 4 by lift off. It is also possible to use a method of manufacturing a piezoelectric thin film resonator 1C in which as shown in FIG. 31, the sputtering device 65 forms the electrode material layer 3b by forming a layer of aluminum (Al) and then forms the electrode material layer 3b on a thin film 32b by lift off, and the sputtering device 68 forms the electrode material layer 6b by forming an aluminum (Al) layer, and then forms the upper electrode 6 on the piezoelectric film 4 by lift off. According to this method of manufacturing, the aluminum that forms the lower electrodes 3 and the upper electrode 6 is light, so that it is possible to reliably and easily form a piezoelectric thin film resonator with a sufficiently high resonance frequency, for example.

In addition, although masks in which exposure holes are formed so that the upper surface in the thickness direction of the resist layer protrudes more at the rims of the exposure holes than the lower surface above the formation parts are described in the above embodiments, the present invention is not limited to this. For example, it is possible to construct a mask by forming the exposure hole so that any position in the thickness direction of the resist layer (for example, a center in the thickness direction) protrudes above the formation part more than a lower surface in the thickness direction. In addition, the various materials used in the methods of manufacturing given in the above embodiments are merely examples, and the present invention is not limited to methods of manufacturing that use these materials. The embodiments of the present invention have been described using an electronic component that functions as a series-parallel-series type ladder filter using the three unit piezoelectric thin film resonators U1 to U3, but an electronic component according to the present invention is not limited to being constructed as a filter and can be constructed as a duplexer. In this case, the number of unit piezoelectric thin film resonators used and the connection pattern is not limited to the example described in the embodiments of the present invention, and can be freely chosen.

The invention claimed is:

1. A method of manufacturing a piezoelectric thin film resonator, the method comprising:
   forming a piezoelectric film on a substrate so as to cover a lower electrode formed on the substrate,
   forming a resist layer so as to cover the piezoelectric film,
   forming a mask composed of the resist layer on the piezoelectric film by forming, in the resist layer, an exposure hole for exposing a formation part of an upper electrode on the piezoelectric film,
   forming an electrode material layer for the upper electrode on the piezoelectric film exposed via the exposure hole and on the mask, and
   forming the upper electrode by removing the electrode material layer on the mask by removing the mask.

2. The method of manufacturing a piezoelectric thin film resonator according to claim 1, wherein forming the mask comprises forming the exposure hole such that an upper surface side, in the thickness direction of the resist layer protrudes, at a rim of the exposure hole, above the formation part more than a lower surface side.

3. The method of manufacturing a piezoelectric thin film resonator according to claim 2, wherein after forming the resist layer, surface treating the resist layer by soaking in a benzene-type solvent, and forming the exposure hole in the resist layer so as to expose the formation part.

4. The method of manufacturing a piezoelectric thin film resonator according to claim 2, wherein forming the exposure hole comprises forming a first resist layer that can be dissolved by a developer liquid, forming a second resist layer so as to cover the first resist layer, performing an exposure process on the second resist layer, and soaking in the developer liquid so that the exposure hole passes through both the first resist layer and the second resist layer.

5. The method of manufacturing a piezoelectric thin film resonator according to claim 1, wherein the piezoelectric film comprises zinc oxide (ZnO).

6. The method of manufacturing a piezoelectric thin film resonator according to claim 1, wherein the electrode material layer comprises aluminum (Al) or gold (Au).

7. A method of manufacturing a piezoelectric thin film resonator, the method comprising:

forming a resist layer so as to cover a substrate, forming a mask composed of the resist layer on the substrate by forming, in the resist layer, an exposure hole for exposing a formation part of a lower electrode on the substrate, forming an electrode material layer for the lower electrode on the substrate exposed via the exposure hole and on the mask, forming the lower electrode by removing the electrode material layer on the mask by removing the mask, forming a piezoelectric film on the substrate so as to cover the lower electrode, and forming an upper electrode on the piezoelectric film.

8. The method of manufacturing a piezoelectric thin film resonator according to claim 7, wherein forming the mask comprises forming the exposure hole such that an upper surface sides, in the thickness direction of the resist layer protrudes, at a rim of the exposure hole, above the formation part more than a lower surface side.

9. The method of manufacturing a piezoelectric thin film resonator according to claim 8, wherein after forming the resist layer, surface treating the resist layer by soaking in a benzene-type solvent, and forming the exposure hole in the resist layer so as to expose the formation part.

10. The method of manufacturing a piezoelectric thin film resonator according to claim 8, wherein forming the exposure hole comprises forming a first resist layer that can be dissolved by a developer liquid, forming a second resist layer so as to cover the first resist layer, performing an exposure process on the second resist layer, and soaking in the developer liquid so that the exposure hole passes through both the first resist layer and the second resist layer.

11. The method of manufacturing a piezoelectric thin film resonator according to claim 7, wherein the piezoelectric film comprises zinc oxide (ZnO).

12. The method of manufacturing a piezoelectric thin film resonator according to claim 7, wherein the electrode material layer comprises aluminum (Al) or gold (Au).

13. A method of manufacturing a piezoelectric thin film resonator, the method comprising:

forming a resist layer so as to cover a substrate, forming a mask composed of the resist layer on the substrate by forming, in the resist layer, an exposure hole for exposing a formation part of a lower electrode on the substrate, forming an electrode material layer for the lower electrode on the substrate exposed via the exposure hole and on the mask, forming the lower electrode by removing the electrode material layer on the mask by removing the mask, forming a piezoelectric film on the substrate so as to cover the lower electrode and forming a resist layer so as to cover the piezoelectric film, forming a mask composed of the resist layer on the piezoelectric film by forming, in the resist layer on the piezoelectric film, an exposure hole for exposing a formation part of an upper electrode on the piezoelectric film, forming an electrode material layer for the upper electrode on the piezoelectric film exposed via the exposure hole and on the mask, and forming the upper electrode by removing the electrode material layer on the mask by removing the mask.

14. The method of manufacturing a piezoelectric thin film resonator according to claim 13, wherein forming the mask comprises forming the exposure hole such that an upper surface side, in the thickness direction of the resist layer protrudes, at a rim of the exposure hole, above the formation part more than a lower surface side.

15. The method of manufacturing a piezoelectric thin film resonator according to claim 14, wherein after forming the resist layer, surface treating the resist layer by soaking in a benzene-type solvent, and forming the exposure hole in the resist layer so as to expose the formation part.

16. The method of manufacturing a piezoelectric thin film resonator according to claim 14, wherein forming the exposure hole comprises forming a first resist layer that can be dissolved by a developer liquid, forming a second resist layer so as to cover the first resist layer, performing an exposure process on the second resist layer, and soaking in the developer liquid so that the exposure hole passes through both the first resist layer and the second resist layer.

17. The method of manufacturing a piezoelectric thin film resonator according to claim 13, wherein the piezoelectric film comprises zinc oxide (ZnO).

18. The method of manufacturing a piezoelectric thin film resonator according to claim 13, wherein the electrode material layers comprise aluminum (Al) or gold (Au).

* * * * *